(12) United States Patent
Seibald et al.

(10) Patent No.: US 10,752,836 B2
(45) Date of Patent: Aug. 25, 2020

(54) PHOSPHOR

(71) Applicant: OSRAM OLED GMBH, Regensburg (DE)

(72) Inventors: Markus Seibald, Kaufering (DE); Tim Fiedler, Landsberg am Lech (DE); Dominik Baumann, Munich (DE); Hubert Huppertz, Innsbruck (AT); Klaus Wurst, Zirl (AT); Gunter Heymann, Innsbruck (AT); Dominik Wilhelm, Innsbruck (AT)

(73) Assignee: OSRAM OLED GMBH, Regensburg (DE)

( * ) Notice: Subject to any disclaimer, the term of this patent is extended or adjusted under 35 U.S.C. 154(b) by 330 days.

(21) Appl. No.: 15/572,449

(22) PCT Filed: May 6, 2016

(86) PCT No.: PCT/EP2016/060208
§ 371 (c)(1),
(2) Date: Nov. 7, 2017

(87) PCT Pub. No.: WO2016/177890
PCT Pub. Date: Nov. 10, 2016

(65) Prior Publication Data
US 2018/0148644 A1 May 31, 2018

(30) Foreign Application Priority Data
May 7, 2015 (DE) .................. 10 2015 107 162

(51) Int. Cl.
*C09K 11/77* (2006.01)
*C09K 11/08* (2006.01)
(Continued)

(52) U.S. Cl.
CPC ...... *C09K 11/7734* (2013.01); *C01B 21/0602* (2013.01); *C04B 35/581* (2013.01);
(Continued)

(58) Field of Classification Search
CPC ............ C09K 11/0883; C09K 11/7734; H01L 33/502
See application file for complete search history.

(56) References Cited

U.S. PATENT DOCUMENTS

| | | | |
|---|---|---|---|
| 7,808,012 B2 | 10/2010 | Masuda et al. | |
| 9,458,379 B2 | 10/2016 | Hirosaki et al. | |

(Continued)

FOREIGN PATENT DOCUMENTS

| CN | 101412910 A | 4/2009 |
|---|---|---|
| CN | 102559177 A | 7/2012 |

(Continued)

OTHER PUBLICATIONS

Detail information for K2Zn6O7, The Materials Project; materialsproject.org, no date.*

(Continued)

*Primary Examiner* — C Melissa Koslow
(74) *Attorney, Agent, or Firm* — Slater Matsil, LLP

(57) ABSTRACT

A phosphor is disclosed. In an embodiment the phosphor includes an inorganic compound having at least one activator E and N and/or O in its empirical formula, wherein E is selected from the group consisting of Mn, Cr, Ni, Ce, Pr, Nd, Sm, Eu, Tb, Dy, Ho, Er, Yb, Tm, Li, Na, K, Rb, Cs and combinations thereof, and wherein the inorganic compound crystallizes in a crystal structure with the same atomic sequence as in $K_2Zn_6O_7$.

13 Claims, 14 Drawing Sheets

| $LiO_2 \leftrightarrow AlN_2$ | $Zn_2 \leftrightarrow LiAl$ | $ZnO \leftrightarrow AlN$ |
|---|---|---|
| $Sr_4Li_{1+y/2}Al_{11-y/2}N_{14-y}O_y:E$ | $SrLi_{1-z}Al_{11-z}Zn_{2z}N_{14}:E$ | $Sr_4Li_1Al_{11-x}Zn_xN_{14-x}O_x:E$ |
| $Sr_4LiAl_{11}N_{14}:E$ | $Sr_4LiAl_{11}N_{14}:E$ | $Sr_4LiAl_{11}N_{14}:E$ |
| $Sr_8Li_3Al_{21}N_{26}O_2:E$ | $Sr_4Al_{10}Zn_2N_{14}:E$ | $Sr_4LiAl_{10}Zn_1N_{13}O:E$ |
| $Sr_2LiAl_5N_6O:E$ | | $Sr_4LiAl_9Zn_2N_{12}O_2:E$ |
| $Sr_8Li_5Al_{19}N_{22}O_6:E$ | | $Sr_4LiAl_8Zn_3N_{11}O_3:E$ |
| $Sr_4Li_3Al_9N_{10}O_4:E$ | | $Sr_4LiAl_7Zn_4N_{10}O_4:E$ |
| $Sr_8Li_7Al_{17}N_{18}O_{10}:E$ | | $Sr_4LiAl_6Zn_5N_9O_5:E$ |
| $Sr_2Li_2Al_4N_4O_3:E$ | | $Sr_4LiAl_5Zn_6N_8O_6:E$ |
| $Sr_8Li_9Al_{15}N_{14}O_{14}:E$ | | $Sr_4LiAl_4Zn_7N_7O_7:E$ |
| $Sr_4Li_5Al_7N_6O_8:E$ | | $Sr_4LiAl_3Zn_8N_6O_8:E$ |
| $Sr_8Li_{11}Al_{13}N_{10}O_{18}:E$ | | $Sr_4LiAl_2Zn_9N_5O_9:E$ |
| $Sr_2Li_3Al_3N_2O_5:E$ | | $Sr_4LiAlZn_{10}N_4O_{10}:E$ |
| $Sr_8Li_{13}Al_{11}N_6O_{22}:E$ | | $Sr_4LiZn_{11}N_3O_{11}:E$ |
| $Sr_4Li_7Al_5N_2O_{12}:E$ | | |
| $Sr_8Li_{15}Al_9N_2O_{26}:E$ | | |
| $Sr_2Li_4Al_2O_7:E$ | | |

(51) Int. Cl.
    *C01B 21/06*     (2006.01)
    *C04B 35/581*     (2006.01)
    *C04B 35/626*     (2006.01)
    *H01L 33/50*     (2010.01)

(52) U.S. Cl.
    CPC ...... *C04B 35/6268* (2013.01); *C09K 11/0883* (2013.01); *H01L 33/502* (2013.01); *C04B 2235/3203* (2013.01); *C04B 2235/3217* (2013.01); *C04B 2235/3224* (2013.01); *C04B 2235/3852* (2013.01); *C04B 2235/3865* (2013.01); *C04B 2235/44* (2013.01); *C04B 2235/445* (2013.01); *C04B 2235/76* (2013.01); *C04B 2235/761* (2013.01)

(56) References Cited

U.S. PATENT DOCUMENTS

| | | |
|---|---|---|
| 9,534,171 B2 | 1/2017 | Hirosaki et al. |
| 2009/0014741 A1 | 1/2009 | Masuda et al. |
| 2013/0127333 A1 | 5/2013 | Jia et al. |

FOREIGN PATENT DOCUMENTS

| | | |
|---|---|---|
| CN | 104024375 A | 9/2014 |
| CN | 104080886 A | 10/2014 |
| EP | 2801599 A1 | 11/2014 |
| JP | 2013539490 A | 10/2013 |
| WO | 2010119375 A1 | 10/2010 |
| WO | 2013175336 A1 | 11/2013 |
| WO | 2013180216 A1 | 12/2013 |
| WO | 2014003076 A1 | 1/2014 |
| WO | 2015044106 A1 | 4/2015 |

OTHER PUBLICATIONS

Pust, P. et al., "Narrow-band Red-Emitting Sr[LiAl3N4]: Eu2+ as a Next-Generation LED-Phosphor Material," Natures Materials, Jun. 22, 2014, 6 pages.

Zhang, Z. et al., "Preparation, Electronic Structure and Photoluminescence Properties of RE )RE=Ce, Yb)-Activated SrAlSi4N7 Phosphors," Journals of Materials Chemistry C, XP-002758971, RSC Publishing, 2013, 10 pages.

\* cited by examiner

FIG 16A

| empirical formula | $Sr_4LiAl_{11}N_{14}$ |
|---|---|
| formula mass / g × cm$^{-1}$ | 850.34 |
| crystal system | orthorhombic |
| space group | *Pnnm* (no. 58) |
| $a$ / Å | 10.4291(7) |
| $b$ / Å | 10.4309(7) |
| $c$ / Å | 3.2349(2) |
| cell volume / Å$^3$ | 351.91(4) |
| Z | 1 |
| density / g × cm$^{-3}$ | 4.012 |
| $\mu$ / mm | 15.798 |
| $T$ / K | 193(2) |
| diffractometer | Bruker D8 Quest |
| radiation | Mo-K$\alpha$ ($\lambda$=0.71073 Å) |
| measurement range | 2.762 < $\theta$ < 34.995 |
|  | $-16 \leq h \leq 16$ |
|  | $-9 \leq k \leq 16$ |
|  | $-5 \leq l \leq 5$ |
| independent reflections ($l > 2\sigma$) | 873 |
| refinement parameter | 48 |
| $R_{int}$; $R_\sigma$ | 0.0174; 0.0281 |
| $R_1$ (all data); $R_1$ ($l > 2\sigma$) | 0.0220; 0.0213 |
| $wR_2$ (all data); $wR_2$ ($l > 2\sigma$) | 0.0517; 0.0513 |
| GooF | 1.123 |

FIG 16B

| atom | x | y | z | occupation |
|---|---|---|---|---|
| Sr1 | 0.35249(4) | 0.36915(4) | 0 | 1 |
| Al1 | 0.11043(17) | 0.14316(16) | 0 | 0.75 |
| Li1 | 0.11043(17) | 0.14316(16) | 0 | 0.25 |
| Al2 | 0.15911(11) | 0.59327(10) | 0 | 1 |
| Al3 | 0.57944(13) | 0.15510(10) | 0 | 1 |
| N1 | 0.0127(3) | 0.6981(3) | 0 | 1 |
| N2 | 0.6762(3) | 0.0022(3) | 0 | 1 |
| N3 | 0.6933(3) | 0.3024(3) | 0 | 1 |
| N4 | 0 | 0 | 0 | 1 |

FIG 16C

| atom | $U_{11}$ | $U_{22}$ | $U_{33}$ | $U_{23}$ | $U_{13}$ | $U_{12}$ |
|---|---|---|---|---|---|---|
| Sr1 | 0.00998(14) | 0.00864(14) | 0.00448(10) | 0 | 0 | 0.00344(11) |
| Al1 | 0.0198(7) | 0.0139(9) | 0.0011(5) | 0 | 0 | -0.0092(6) |
| Li1 | 0.0198(7) | 0.0139(9) | 0.0011(5) | 0 | 0 | -0.0092(6) |
| Al2 | 0.0004(4) | 0.0059(4) | 0.0038(4) | 0 | 0 | 0.0001(3) |
| Al3 | 0.0079(5) | 0.0068(5) | 0.0061(5) | 0 | 0 | 0.0005(3) |
| N1 | 0.0044(10) | 0.0060(10) | 0.0089(11) | 0 | 0 | 0.0027(8) |
| N2 | 0.0141(13) | 0.0050(10) | 0.0044(11) | 0 | 0 | -0.0021(8) |
| N3 | 0.0054(11) | 0.0093(12) | 0.0103(9) | 0 | 0 | -0.0050(9) |
| N4 | 0.012(2) | 0.0081(17) | 0.0077(12) | 0 | 0 | 0.0019(14) |

FIG 18A

| $LiO_2 \leftrightarrow AlN_2$ | $Zn_2 \leftrightarrow LiAl$ | $ZnO \leftrightarrow AlN$ |
|---|---|---|
| $Sr_4Li_{1+y/2}Al_{11-y/2}N_{14-y}O_y$:E | $SrLi_{1-z'}Al_{11-z'}Zn_{2z'}N_{14}$:E | $Sr_4Li_1Al_{11-x'}Zn_{x'}N_{14-x'}O_{x'}$:E |
| $Sr_4LiAl_{11}N_{14}$:E | $Sr_4LiAl_{11}N_{14}$:E | $Sr_4LiAl_{11}N_{14}$:E |
| $Sr_8Li_3Al_{21}N_{26}O_2$:E | $Sr_4Al_{10}Zn_2N_{14}$:E | $Sr_4LiAl_{10}Zn_1N_{13}O$:E |
| $Sr_2LiAl_5N_6O$:E | | $Sr_4LiAl_9Zn_2N_{12}O_2$:E |
| $Sr_8Li_5Al_{19}N_{22}O_6$:E | | $Sr_4LiAl_8Zn_3N_{11}O_3$:E |
| $Sr_4Li_3Al_9N_{10}O_4$:E | | $Sr_4LiAl_7Zn_4N_{10}O_4$:E |
| $Sr_8Li_7Al_{17}N_{18}O_{10}$:E | | $Sr_4LiAl_6Zn_5N_9O_5$:E |
| $Sr_2Li_2Al_4N_4O_3$:E | | $Sr_4LiAl_5Zn_6N_8O_6$:E |
| $Sr_8Li_9Al_{15}N_{14}O_{14}$:E | | $Sr_4LiAl_4Zn_7N_7O_7$:E |
| $Sr_4Li_5Al_7N_6O_8$:E | | $Sr_4LiAl_3Zn_8N_6O_8$:E |
| $Sr_8Li_{11}Al_{13}N_{10}O_{18}$:E | | $Sr_4LiAl_2Zn_9N_5O_9$:E |
| $Sr_2Li_3Al_3N_2O_5$:E | | $Sr_4LiAlZn_{10}N_4O_{10}$:E |
| $Sr_8Li_{13}Al_{11}N_6O_{22}$:E | | $Sr_4LiZn_{11}N_3O_{11}$:E |
| $Sr_4Li_7Al_5N_2O_{12}$:E | | |
| $Sr_8Li_{15}Al_9N_2O_{26}$:E | | |
| $Sr_2Li_4Al_2O_7$:E | | |

FIG 18B

| MgO↔AlN | Al$_3$↔Si$_2$Li | Al$_2$↔MgSi |
|---|---|---|
| Sr$_4$Li$_1$Al$_{11-y'''}$Mg$_{y'''}$N$_{14-y'''}$O$_{y'''}$:E | Sr$_4$Li$_{1+z'''}$Si$_{2z'''}$N$_{14}$:E | Sr$_4$Li$_1$Al$_{11-2x'''}$Si$_{x'''}$Mg$_{x'''}$N$_{14}$:E |
| Sr$_4$LiAl$_{11}$N$_{14}$:E | Sr$_4$LiAl$_{11}$N$_{14}$:E | Sr$_4$LiAl$_{11}$N$_{14}$:E |
| Sr$_4$LiAl$_{10}$Mg$_1$N$_{13}$O:E | Sr$_4$Li$_2$Al$_8$Si$_2$N$_{14}$:E | Sr$_4$LiAl$_9$SiMgN$_{14}$:E |
| Sr$_4$LiAl$_9$Mg$_2$N$_{12}$O$_2$:E | Sr$_4$Li$_3$Al$_5$Si$_4$N$_{14}$:E | Sr$_4$LiAl$_7$Si$_2$Mg$_2$N$_{14}$:E |
| Sr$_4$LiAl$_8$Mg$_3$N$_{11}$O$_3$:E | Sr$_4$Li$_4$Al$_2$Si$_6$N$_{14}$:E | Sr$_4$LiAl$_5$Si$_3$Mg$_3$N$_{14}$:E |
| Sr$_4$LiAl$_7$Mg$_4$N$_{10}$O$_4$:E | | Sr$_4$LiAl$_3$Si$_4$Mg$_4$N$_{14}$:E |
| Sr$_4$LiAl$_6$Mg$_5$N$_9$O$_5$:E | | Sr$_4$LiAlSi$_5$Mg$_5$N$_{14}$:E |
| Sr$_4$LiAl$_5$Mg$_6$N$_8$O$_6$:E | | |
| Sr$_4$LiAl$_4$Mg$_7$N$_7$O$_7$:E | | |
| Sr$_4$LiAl$_3$Mg$_8$N$_6$O$_8$:E | | |
| Sr$_4$LiAl$_2$Mg$_9$N$_5$O$_9$:E | | |
| Sr$_4$LiAlMg$_{10}$N$_4$O$_{10}$:E | | |
| Sr$_4$LiMg$_{11}$N$_3$O$_{11}$:E | | |

PHOSPHOR

This patent application is a national phase filing under section 371 of PCT/EP2016/060208, filed May 6, 2016, which claims the priority of German patent application 10 2015 107 162.2, filed May 7, 2015, each of which is incorporated herein by reference in its entirety.

TECHNICAL FIELD

The invention relates to a phosphor, a method for producing a phosphor, use of a phosphor in a conversion element and use of a phosphor for the conversion of light.

BACKGROUND

For devices which are based on white light-emitting diodes (LEDs), particularly for backlighting, there are only a few solid phosphors which meet the requirements of an LED phosphor, in particular with emission in the dark red region of the electromagnetic spectrum. Hitherto, use has mainly been made of two orange to red-emitting phosphors of the formula $(Sr,Ba)_2Si_5N_8:Eu^{2+}$ and $(Sr,Ca)AlSiN_3:Eu^{2+}$. However, these have significant disadvantages with regard to emission, coverage of the color space, half-value width (FWHM=Full Width Half Maximum) and spectral filtering. In the case of the phosphor $(Sr,Ba)_2Si_5N_8:Eu$, the emission wavelength may be shifted from the orange into the red region of the spectrum by replacing barium with strontium. However, this replacement results in a reduction in the long-term stability of the phosphor. $(Sr,Ba)_2Si_5N_8:Eu^{2+}$ phosphors additionally exhibit large half-value widths and do not exhibit any emission in the dark red region of the spectrum, i.e., no emission at a dominant wavelength of over 620 nm. Although the phosphor $(Sr,Ca)AlSiN_3:Eu^{2+}$ already exhibits emission in the dark red region of the spectrum, it exhibits very broad emission, which extends into the non-visible region of the electromagnetic spectrum, whereby the luminescence efficiency of this phosphor is reduced. There is therefore considerable demand for a phosphor which exhibits emission in the dark red region of the electromagnetic spectrum and a small half-value width and thereby little emission outside the visible region of the electromagnetic spectrum.

WO 2013/175336 A1 and Nature Materials 2014, P. Pust et al., "Narrow-band red emitting $Sr[LiAl_3N_4]:Eu^{2+}$ as a next-generation LED-phosphor material" disclose a phosphor of the formula $SrLiAl_3N_4:Eu^{2+}$ which already has an emission in the dark red region of the electromagnetic spectrum and a small half-value width, said phosphor additionally exhibiting little emission outside the visible region of the electromagnetic spectrum. However, the phosphor has a lower quantum efficiency, i.e., a poor ratio between the number of emitted and absorbed photons, compared with $(Sr,Ba)_2Si_5N_8:Eu^{2+}$ and $(Sr,Ca)AlSiN_3:Eu^{2+}$.

SUMMARY OF THE INVENTION

Embodiments provide a phosphor which has less emission outside the visible region of the electromagnetic spectrum, exhibits a small half-value width and additionally has high quantum efficiency. Further embodiments provide an efficient method for producing a phosphor, use of a phosphor in a conversion element and use of a phosphor for the conversion of light.

A phosphor is provided.

According to at least one embodiment, the phosphor comprises an inorganic compound, which comprises at least one activator E and N and/or O in its empirical formula. The activator E is here from a group comprising Mn, Cr, Ni, Ce, Pr, Nd, Sm, Eu, Tb, Dy, Ho, Er, Yb, Tm, Li, Na, K, Rb, Cs and combinations thereof. In particular, the activator E is responsible for the wavelength of the emitted radiation of the phosphor. Preferably, E is equal to Eu in combination with one, two or more further elements E, preferably selected from Mn or Li. Very particularly preferably, E=Eu, preferably $Eu^{2+}$.

According to at least one embodiment, the phosphor consists of the inorganic compound. The phosphor then comprises at least one activator E and N and/or O in its empirical formula, wherein E is selected from a group comprising Mn, Cr, Ni, Ce, Pr, Nd, Sm, Eu, Tb, Dy, Ho, Er, Yb, Tm, Li, Na, K, Rb, Cs and combinations thereof.

According to one embodiment, the phosphor may comprise different phases, inter alia the inorganic compound, or it may consist of one or more further phases and the inorganic compound.

According to at least one embodiment, the inorganic compound crystallizes in a crystal structure with the same atomic sequence as in $K_2Zn_6O_7$. The fact that the inorganic compound crystallizes in a crystal structure with the same atomic sequence as in $K_2Zn_6O_7$ means here and hereinafter that the sequence of atoms of the inorganic compound follows the same pattern as the sequence of atoms in $K_2Zn_6O_7$. In other words, the crystal structure has the same structural motifs as $K_2Zn_6O_7$. If, for example, the inorganic compound or the phosphor follows the empirical formula $(Sr,Eu)_2(Li_{0.5}Al_{5.5})N_7$, Sr and Eu occupy the sites of K, Li and Al occupy the sites of Zn and N occupies the sites of O in $K_2Zn_6O_7$.

According to at least one embodiment, the inorganic compound or the phosphor is described in the orthorhombic space group space group Pnnm. In the orthorhombic description with the space group Pnnm, lattice parameter c is in particular in the range from 3.21-3.29 Å, lattice parameter a in the range from 10.24-10.43 Å and lattice parameter b in the range from 10.29-10.43 Å. Particularly preferably, the lattice parameters in the orthorhombic description with the space group Pnnm are a=10.4291(7) Å, b=10.4309(7) Å and c=3.2349(2) and α=β=γ=90°. Alternatively, the crystal structure may also be described in a tetragonal crystal system due to twinning and pseudosymmetry. Descriptions in other space groups are also possible.

According to at least one embodiment, the inorganic compound comprises one of the following general empirical formula: $(AX_aAY_bAZ_c)(BV_dBW_eBX_fBY_gBZ_h)(CX_nCY_y):E$, wherein AX is selected from a group of monovalent metals, AY is selected from a group of divalent metals, AZ is selected from a group of trivalent metals, BV is selected from a group of monovalent metals, BW is selected from a group of divalent metals, BX is selected from a group of trivalent elements, BY is selected from a group of tetravalent elements, BZ is selected from a group of pentavalent elements, CX is selected from a group which comprises O, S, C, F, Cl, Br, I and combinations thereof, CY=N, E is selected from a group comprising Mn, Cr, Ni, Ce, Pr, Nd, Sm, Eu, Tb, Dy, Ho, Er, Yb, Tm, Li, Na, K, Rb, Cs and combinations thereof, wherein: 1a+2b+3c+1d+2e+3f+4g+5h−2n−3y=z, 3<a+b+c<5, 10<d+e+f+g+h<14, 12<n+y<16 and −0.5≤z≤0.5.

Providing the conditions 1a+2b+3c+1d+2e+3f+4g+5h−2n−3y=z, 3<a+b+c<5, 10<d+e+f+g+h<14, 12<n+y<16 and −0.5≤z≤0.5 are met, it is possible for individual parameters a, b, c, d, e, f, g, h, n or y to assume the value zero. In other words, not all the elements AX, AY, AZ, BV, BW, BX, BY, BZ, CX and CY are necessarily contained in the inorganic compound.

According to at least one embodiment, the inorganic compound comprises one of the following general empirical formula: $(AX_aAY_bAZ_e)(BV_dBW_eBX_fBY_gBZ_h)(CX_nCY_y)$:E, wherein AX is selected from a group comprising Li, Na, K, Rb, Cs and combinations thereof, AY is selected from a group comprising Mg, Ca, Sr, Ba, Eu, Yb, Mn, Ni and combinations thereof, AZ is selected from a group comprising Sc, Y, La, Pr, Ce, Yb, Cr and combinations thereof, BV=Li, BW is selected from a group comprising Mg, Zn, Mn, Ni and combinations thereof, BX is selected from a group comprising B, Al, Ga, Ce, Cr and combinations thereof, BY is selected from a group comprising Si, Ge, Mn and combinations thereof, BZ=P, CX is selected from a group comprising O, S, C, F, Cl, Br, I and combinations thereof, CX preferably being selected from a group comprising O, S and combinations thereof, CY=N and E is selected from a group comprising Mn, Cr, Ni, Ce, Pr, Nd, Sm, Eu, Tb, Dy, Ho, Er, Yb, Tm, Li, Na, K, Rb, Cs and combinations thereof. In this case the following apply: $1a+2b+3c+1d+2e+3f+4g+5h-2n-3y=z$, $3<a+b+c<5$, $10<d+e+f+g+h<14$, $12<n+y<16$ and $-0.5 \le z \le 0.5$. The inorganic compound comprises N and/or O in its empirical formula.

According to at least one embodiment, the inorganic compound comprises the following general empirical formulae: $(AX_aAY_bAZ_c)(BV_dBW_eBX_fBY_gBZ_h)(CX_nCY_y)$:E, wherein AX is selected from a group comprising Li, Na, K and combinations thereof, AY is selected from a group comprising Mg, Ca, Sr and Ba, AZ is selected from a group comprising Sc, Y, La, Pr, Ce, Yb and combinations thereof, BV=Li, BW is selected from a group comprising Mg, Zn and combinations thereof, BX is selected from a group comprising B, Al, Ga and combinations thereof, BY is selected from a group comprising Si, Ge, Mn and combinations thereof, CX is selected from a group comprising O, S and combinations thereof, CY=N and E is selected from a group comprising Mn, Cr, Ni, Ce, Pr, Nd, Sm, Eu, Tb, Dy, Ho, Er, Yb, Tm, Li, Na, K, Rb, Cs and combinations thereof, and wherein h=0.

According to a preferred embodiment, the following applies:

$1a+2b+3c+1d+2e+3f+4g+5h-2n-3y=z$, $a+b+c=4$, $d+e+f+g+h=12$, $n+y=14$, and $-0.1 \le z \le 0.1$.

According to at least one embodiment, z=0. This embodiment thus relates to an electroneutral inorganic compound or an electroneutral phosphor. The phosphor is thus very stable and may be used for the most varied of applications. The phosphor is in particular suitable for application in a light-emitting diode, since it exhibits stable and uniform emission over the service life of the light-emitting diode.

According to at least one embodiment, the inorganic compound or the phosphor comprises one of the following empirical formulae: $M_4Li_{1+y''/2}Al_{11-y''/2}N_{14-y'}O_{y'}$:E, $M_4Li_{1-z'}Al_{11-z'}Zn_{2z'}N_{14}$:E, $M_4LiAl_{11-x'}Zn_{x'}N_{14-x'}O_{x'}$:E, $M_4LiAl_{11-y''}Mg_{y''}N_{14-y''}O_{y''}$:E, $M_4Li_{1+z''}Al_{11-3z''}Si_{2z''}N_{14}$:E or $M_4LiAl_{11-2x''}Si_{x''}Mg_{x''}N_{14}$:E.

In this case the following apply: M=Ca, Sr and/or Ba, $0 \le y' \le 14$, $0 \le z' \le 1$, $0 \le x' \le 11$, $0 \le y'' \le 11$, $0 \le z'' \le 3$ and $0 \le x'' \le 5$. E in particular replaces M in the empirical formula and occupies the lattice sites of M.

According to at least one embodiment, M contains at least Sr, for example, Sr and Ba or Sr and Ca. Very particularly preferably, M=Sr.

According to at least one embodiment, the inorganic compound or the phosphor comprises one of the following empirical formulae: $M_{4-x}Eu_xLi_{1+y''/2}Al_{11-y''/2}N_{14-y'}O_{y'}$, $M_{4-x}Eu_xLi_{1-z'}Al_{11-z'}Zn_{2z'}N_{14}$, $M_{4-x}Eu_xLiAl_{11-x'}Zn_{x'}N_{14-x'}O_{x'}$, $M_{4-x}Eu_xLiAl_{11-y''}Mg_{y''}N_{14-y''}O_{y''}$, $M_{4-x}Eu_xLi_{1+z''}Al_{11-3z''}Si_{2z''}N_{14}$ or $M_{4-x}Eu_xLiAl_{11-2x''}Si_{x''}Mg_{x''}N_{14}$.

In this case the following apply: M=Ca, Sr and/or Ba, and $0 \le y' \le 14$, $0 \le z' \le 1$, $0 \le x' \le 11$, $0 \le y'' \le 11$, $0 \le z'' \le 3$, $0 \le x'' \le 5$ and $0 < x \le 2$.

The following preferably applies: $0.001 \le x \le 0.4$, particularly preferably $0.01 \le x \le 0.2$. Eu or $Eu^{2+}$ ions in this case in particular replace M and occupy the lattice sites of M.

According to at least one embodiment, the inorganic compound or the phosphor has the empirical formula $M_{4-x}Eu_xLi_{1+y''/2}Al_{11-y''/2}N_{14-y'}O_{y'}$, preferably $Sr_{4-x}Eu_xLi_{1+y''/2}Al_{11-y''/2}N_{14-y'}O_{y'}$, wherein y'=0, 1, 2, 3, 4, 5, 6, 7, 8, 9, 10, 11, 12, 13 or 14 and $0<x \le 2$. On the basis of the empirical formula $M_{4-x}Eu_xLiAl_{11}N_{14}$, in this embodiment $AlN_2$ may be replaced in part by $LiO_2$. Surprisingly, the crystal structure is retained, while the spectral position and thus the peak wavelength of the phosphor shifts. In particular, the peak wavelength is shifted to shorter wavelengths. The result is the following empirical formulae: $M_{4-x}Eu_xLiAl_{11}N_{14}$, $(M_{4-x}Eu_x)_2Li_3Al_{21}n_{26}O_2$, $(M_{4-x}Eu_x)_{0.5}LiAl_5N_6O$, $(M_{4-x}Eu_x)_2Li_5Al_{19}N_{22}O_6$, $M_{4-x}Eu_xLi_3Al_9N_{10}O_4$, $(M_{4-x}Eu_x)_2Li_7Al_{17}N_{18}O_{10}$, $(M_{4-x}Eu_x)_{0.5}Li_2Al_4N_4O_3$, $(M_{4-x}Eu_x)_2Li_9Al_{15}N_{14}O_{14}$, $M_{4-x}Eu_xLi_5Al_7N_6O_8$, $(M_{4-x}Eu_x)_2Li_{11}Al_{13}N_{10}O_{18}$, $(M_{4-x}Eu_x)_{0.5}Li_3Al_3N_2O_5$, $(M_{4-x}Eu_x)_2Li_{13}Al_{11}N_6O_{22}$, $M_{4-x}Eu_xLi_7Al_5N_2O_{12}$, $(M_{4-x}Eu_x)_2Li_{15}Al_9N_2O_{26}$, or $(M_{4-x}Eu_x)_{0.5}Li_4Al_2O_7$, and/or $Sr_{4-x}Eu_xLiAl_{11}N_{14}$, $(Sr_{4-x}Eu_x)_2Li_3Al_{21}N_{26}O_2$, $(Sr_{4-x}Eu_x)_{0.5}LiAl_5N_6O$, $(Sr_{4-x}Eu_x)_2Li_5Al_{19}N_{22}O_6$, $Sr_{4-x}Eu_xLi_3Al_9N_{10}O_4$, $(Sr_{4-x}Eu_x)_2Li_7Al_{17}N_{18}O_{10}$, $(Sr_{4-x}Eu_x)_{0.5}Li_2Al_4N_4O_3$, $(Sr_{4-x}Eu_x)_2Li_9Al_{15}N_{14}O_{14}$, $Sr_{4-x}Eu_xLi_5Al_7N_6O_8$, $(Sr_{4-x}Eu_x)_2Li_{11}Al_{13}N_{10}O_{18}$, $(Sr_{4-x}Eu_x)_{0.5}Li_3Al_3N_2O_5$, $(Sr_{4-x}Eu_x)_2Li_{13}Al_{11}N_6O_{22}$, $Sr_{4-x}Eu_xLi_7Al_5N_2O_{12}$, $(Sr_{4-x}Eu_x)_2Li_{15}Al_9N_2O_{26}$ or $(Sr_{4-x}Eu_x)_{0.5}Li_4Al_2O_7$.

According to at least one embodiment, the inorganic compound or the phosphor has the empirical formula $M_{4-x}Eu_xLi_{1-z'}Al_{11-z'}Zn_{2z'}N_{14}$, preferably $Sr_{4-x}Eu_xLi_{1-z'}Al_{11-z'}Zn_{2z'}N_{14}$, wherein z'=0 or 1 and $0<x \le 2$. On the basis of the empirical formula $M_{4-x}Eu_xLiAl_{11}N_{14}$, in this embodiment LiAl may be replaced in part by $Zn_2$. Surprisingly, the crystal structure is retained, while the spectral position and thus the peak wavelength of the phosphor may shift. The result is the following empirical formulae: $M_{4-x}Eu_xLiAl_{11}N_{14}$ or $M_{4-x}Eu_xAl_{10}Zn_2N_{14}$ and/or $Sr_{4-x}Eu_xLi_{11}N_{14}$ or $Sr_{4-x}Eu_xAl_{10}Zn_2N_{14}$.

According to at least one embodiment, the inorganic compound or the phosphor has the empirical formula $M_{4-x}Eu_xLiAl_{11-x'}Zn_{x'}N_{14-x'}O_{x'}$, preferably $Sr_{4-x}Eu_xLiAl_{11-x'}Zn_{x'}N_{14-x'}O_{x'}$, wherein x'=0, 1, 2, 3, 4, 5, 6, 7, 8, 9, 10 or 11 and $0<x \le 2$. On the basis of the empirical formula $M_{4-x}Eu_xLiAl_{11}N_{14}$, in this embodiment AlN may be replaced in part by ZnO.

Surprisingly, the crystal structure is retained, while the spectral position and thus the peak wavelength of the phosphor shifts. In particular, the peak wavelength is shifted to shorter wavelengths. The result is the following empirical formulae: $M_{4-x}Eu_xLiAl_{11}N_{14}$, $M_{4-x}Eu_xLiAl_{10}Zn_1N_{13}O$, $M_{4-x}Eu_xLiAl_9Zn_2N_{12}O_2$, $M_{4-x}Eu_xLiAl_8Zn_3N_{11}O_3$, $M_{4-x}Eu_xLiAl_7Zn_4N_{10}O_4$, $M_{4-x}Eu_xLiAl_6Zn_5N_9O_5$, $M_{4-x}Eu_xLiAl_5Zn_6N_8O_6$, $M_{4-x}Eu_xLiAl_4Zn_7N_7O_7$, $M_{4-x}Eu_xLiAl_3Zn_8N_6O_8$, $M_{4-x}Eu_xLiAl_2Zn_9N_5O_9$, $M_{4-x}Eu_xLiAlZn_{10}2N_4O_{10}$, $M_{4-x}Eu_xLiZn_{11}N_3O_{11}$ or rather $Sr_{4-x}Eu_xLiAl_{11}N_{14}$, $Sr_{4-x}Eu_xLiAl_{10}Zn_1N_{13}$, $Sr_{4-x}$ $Eu_xLiAl_9Zn_2N_{12}O_2$, $Sr_{4-x}Eu_xLiAl_8Zn_3N_{11}O_3$, $Sr_{4-x}Eu_xLiAl_7Zn_4N_{10}O_4$, $Sr_{4-x}Eu_xLiAl_6Zn_5N_9O_5$, $Sr_{4-x}Eu_xLiAl_5Zn_6N_8O_6$, $Sr_{4-x}Eu_xLiAl_4Zn_7N_7O_7$, $Sr_{4-x}Eu_xLiAl_3Zn_8N_6O_8$, $Sr_{4-x}Eu_xLiAl_2Zn_9N_5O_9$, $Sr_{4-x}Eu_xLiAlZn_{10}N_4O_{10}$, $Sr_{4-x}Eu_xLiZn_{115}N_3O_{11}$.

According to at least one embodiment, the inorganic compound or the phosphor has the empirical formula $M_{4-x}Eu_xLiAl_{11-y''}Mg_{y''}N_{14-y''}O_{y''}$, preferably $Sr_{4-x}Eu_x$-$LiAl_{11-y''}Mg_{y''}N_{14-y''}O_{y''}$, wherein y''=0, 1, 2, 3, 4, 5, 6, 7, 8, 9, 10 or 11 and $0<x\leq2$. On the basis of the empirical formula $M_{4-x}Eu_xLiAl_{11}N_{14}$, in this embodiment AlN may be replaced in part by MgO. Surprisingly, the crystal structure is retained, while the spectral position and thus the peak wavelength of the phosphor shifts. In particular, the peak wavelength is shifted to shorter wavelengths. The result is the following empirical formulae: $M_{4-x}Eu_xLiAl_{11}N_{14}$, $M_{4-x}Eu_xLiAl_{10}MgN_{13}O$, $M_{4-x}Eu_xLiAl_9Mg_2N_{12}O_2$, $M_{4-x}Eu_xLiAl_8Mg_3N_{11}O_3$, $M_{4-x}EuLiAl_7Mg_4N_{10}O_4$, $M_{4-x}Eu_xLiAl_6Mg_5N_9O_5$, $M_{4-x}Eu_xLiAl_5Mg_6N_8O_6$, $M_{4-x}Eu_xLiAl_4Mg_7N_7O_7$, $M_{4-x}Eu_xLiAl_3Mg_8N_6O_8$, $M_{4-x}EuLiAl_2Mg_9N_5O_9$, $M_{4-x}Eu_xLiAl_5Mg_6N_8O_6$, $M_{4-x}Eu_xLiMg_{11}N_3O_{11}$ or rather $Sr_{4-x}Eu_xLiAl_{11}N_{14}$, $Sr_{4-x}Eu_xLiAl_{10}Mg_1N_{13}O$, $Sr_{4-x}Eu_xLiAl_9Mg_2N_{12}O_2$, $Sr_{4-x}Eu_xLiAl_8Mg_3N_{11}O_3$, $Sr_{4-x}Eu_xLiAl_7Mg_4N_{10}O_4$, $Sr_{4-x}Eu_xLiAl_6Mg_5N_9O_5$, $Sr_{4-x}Eu_xLiAl_5Mg_6N_8O_6$, $Sr_{4-x}Eu_xLiAl_4Mg_7N_7O_7$, $Sr_{4-x}Eu_xLiAl_3Mg_8N_6O_8$, $Sr_{4-x}Eu_xLiAl_2Mg_9N_5O$, $Sr_{4-x}Eu_xLiAlMg_{10}N_4O_{10}$, $Sr_{4-x}Eu_xLiMg_{11}N_3{}^+O_{11}$.

According to at least one embodiment, the inorganic compound or the phosphor has the empirical formula $M_{4-x}Eu_xLi_{1+z''}Al_{11-3z''}Si_{2z''}N_{14}$, preferably $Sr_{4-x}Eu_xLi_{1+z''}Al_{11-3z''}Si_{2z''}N_{14}$, wherein z''=0, 1, 2 or 3 and $0<x\leq2$. On the basis of the empirical formula $M_{4-x}Eu_xLiAl_{11}Mg_1N_{14}$, in this embodiment $Al_3$ may be replaced in part by $Si_2Li$. Surprisingly, the crystal structure is retained, while the spectral position and thus the peak wavelength of the phosphor may shift. The result is the following empirical formulae $M_{4-x}Eu_xLiAl_{11}N_{14}$, $M_{4-x}Eu_xLi_2Al_8Si_2N_{14}$, $M_{4-x}Eu_xLi_3Al_5Si_4N_{14}$, $M_{4-x}Eu_xLi_4Al_2Si_6N_{14}$ beziehungsweise $Sr_{4-x}Eu_xLiAl_{11}N_{14}$, $Sr_{4-x}Eu_xLi_2Al_8Si_1N_{14}$, $Sr_{4-x}Eu_xLi_3Al_5Si_4N_{14}$, $Sr_{4-x}Eu_xLi_4Al_2Si_6N_{14}$.

According to at least one embodiment, the inorganic compound or the phosphor has the empirical formula $M_{4-x}Eu_xLi_1Al_{11-2x''}Si_{x''}Mg_{x''}N_{14}$, preferably $Sr_{4-x}Eu_xLi_1Al_{11-2x''}Si_{x''}Mg_{x''}N_{14}$, wherein x''=0, 1, 2, 3, 4 or 5 and $0<x\leq2$. On the basis of the empirical formula $M_{4-x}Eu_xLiAl_{11}Mg_1N_{14}$, in this embodiment $Al_2$ may be replaced in part by MgSi. Surprisingly, the crystal structure is retained, while the spectral position and thus the peak wavelength of the phosphor may shift. The result is the following empirical formulae: $M_{4-x}Eu_xLiAl_{11}N_{14}$, $M_{4-x}Eu_xLiAl_9SiMgN_{14}$, $M_{4-x}Eu_xLiAl_7Si_2Mg_2N_{14}$, $M_{4-x}Eu_xLiAl_5Si_3Mg_3N_{14}$, $M_{4-x}Eu_xLiAl_3Si_4Mg_4N_{14}$, $M_{4-x}Eu_xLiAlSi_5Mg_5N_{14}$ or rather $Sr_{4-x}Eu_xLiAl_{11}N_{14}$, $Sr_{4-x}Eu_xLiAl_9SiMgN_{14}$, $Sr_{4-x}Eu_xLiAl_7Si_2Mg_2N_{14}$, $Sr_{4-x}Eu_xLiAl_5Si_3Mg_3N_{14}$, $Sr_{4-x}Eu_xLiAl_3Si_4Mg_4N_{14}$, $Sr_{4-x}Eu_xLiAlSi_5Mg_5N_{14}$.

Interestingly, monocrystals from substitution experiments based on a phosphor of the empirical formula $Sr_{4-x}Eu_xLiAl_{11}N_{14}$, in which, for example, $AlN_2$ is replaced in part by $LiO_2$, LiAl in part by $Zn_2$, AlN in part by ZnO, AlN in part by MgO, $Al_a$ in part by $Si_2Li$ or $Al_2$ in part by MgSi, display significant variations with regard to the lattice parameters in comparison with unsubstituted $Sr_{4-x}Eu_xLiAl_{11}N_{14}$, wherein the crystal structure is retained. Lattice parameter c is here in the range from 3.21-3.29 Å, lattice parameter a in the range from 10.24-10.42 Å and lattice parameter b in the range from 10.29-10.43 Å. As a result of the substitutions, variation may also be observed with regard to emission wavelength. The maximum intensity of the emission, i.e., the peak wavelength, in this case varies between 594 nm and 670 nm for $Sr_4LiAl_{11}N_{14}$:$Eu^{2+}$.

According to at least one embodiment, the inorganic compound or the phosphor has the following empirical formula: $M_{4-x}Eu_xLiAl_{11}N_{14}$ wherein M=Ca, Sr and/or Ba, and $0<x\leq2$. Preferably M=Sr or Sr and Ba or Sr and Ca. This embodiment relates to a nitridoaluminate phosphor.

In one embodiment, in the X-ray powder diffractogram using Cu—$K_{\alpha 1}$ radiation, the inorganic compound or the phosphor has two characteristic reflections in an angular range of 11.5-12.5° 2θ and in an angular range of 18.5-19.5° 2θ. The X-ray diffraction data were recorded by means of flat sample holders on a powder diffractometer (PANalytical Empyrean) with X-Celerator CCD detector in Bragg-Brentano geometry.

According to at least one embodiment, the phosphor has an emission maximum in the range from 500 to 680 nm, preferably between 594 nm and 680 nm. The emission maximum may also be known as peak wavelength.

In the present case, "peak wavelength" here means the wavelength of a peak at which the maximum intensity of the peak is located.

According to at least one embodiment, the phosphor has a dominant wavelength of λ>500 nm, preferably λ>600 nm, particularly preferably λ>620 nm. Dominant wavelength is one possible way of describing non-spectral (polychromatic) light mixtures in terms of spectral (monochromatic) light that evokes a similar perception of hue. In the CIE color space, the line which connects a point for a specific color and the points x=0.333, y=0.333 may be extrapolated in such a way that it meets the outline of the space at two points. The point of intersection lying closer to said color represents the dominant wavelength of the color as wavelength of the pure spectral color at this point of intersection. The dominant wavelength is thus the wavelength which is perceived by the human eye.

According to one embodiment, the phosphor comprises a red-emitting phosphor. The phosphor thus exhibits emission in the red region of the electromagnetic spectrum.

According to one embodiment, the red-emitting phosphor comprises a nitridoaluminate phosphor. In other words, the inorganic compound may be a nitridoaluminate phosphor. In particular, the nitridoaluminate phosphor is doped with $Eu^{2+}$.

"Red-emitting" is understood here and hereinafter to mean that the phosphor inter alia exhibits emission in the red region of the spectrum. For example, the peak wavelength or the dominant wavelength may lie in the green region of the spectrum, but the phosphor may also exhibit emission in the red region of the spectrum.

According to one embodiment, the phosphor or the red-emitting phosphor may comprise different phases, inter alia the $Eu^{2+}$-doped nitridoaluminate phosphor, or it may consist of one or more further phases and the $Eu^{2+}$-doped nitridoaluminate phosphor.

In one embodiment, the phosphor or the red-emitting phosphor consists of the $Eu^{2+}$-doped nitridoaluminate phosphor. This means that the red-emitting phosphor consists of just one phase, namely the $Eu^{2+}$-doped nitridoaluminate phosphor. The red-emitting phosphor may consist of the $Eu^{2+}$-doped nitridoaluminate phosphor, which is present in just one crystal structure.

According to one embodiment, the $Eu^{2+}$-doped nitridoaluminate phosphor crystallizes in a crystal structure with the same atomic sequence as in $K_2Zn_6O_7$.

The crystal structure may in particular be described in the orthorhombic space group Pnnm. In the orthorhombic description with the space group Pnnm, lattice parameter c is in particular in the range from 3.21-3.29 Å, lattice parameter a in the range from 10.24-10.43 Å and lattice parameter b in the range from 10.29-10.43 Å. In particular, the lattice parameters in the orthorhombic description with the space group Pnnm are a=10.4291(7) Å, b=10.4309(7) Å and c=3.2349(2) and $\alpha=\beta=\gamma=90°$. Alternatively, the crystal structure may also be described in a tetragonal crystal system due to twinning and pseudosymmetry. Descriptions in other space groups are also possible.

According to one embodiment, the $Eu^{2+}$-doped nitridoaluminate phosphor or the inorganic compound has the empirical formula $M_{4-x}Eu_xLiAl_{11}N_{14}$, wherein M=Ca, Sr and/or Ba, and $0<x\leq2$, preferably $0.001\leq x\leq0.4$, particularly preferably $0.01\leq x\leq0.2$ applies. $Eu^{2+}$ ions in this case in particular replace M and occupy the lattice sites of M. The $Eu^{2+}$-doped nitridoaluminate phosphor with the empirical formula $M_{4-x}Eu_xLiAl_{11}N_{14}$ preferably crystallizes in a crystal structure with the same atomic sequence as in $K_2Zn_6O_7$.

It is possible for the phosphor or the inorganic compound to comprise further elements, for instance in the form of impurities, wherein these impurities taken together should preferably at most constitute a proportion by weight of the phosphor of at most 1 per mil or 100 ppm or 10 ppm (parts per million).

According to at least one embodiment, the $Eu^{2+}$-doped nitridoaluminate phosphor or the inorganic compound has the empirical formula $Sr_{4-x}Eu_xLiAl_{11}N_{14}$ and $0<x\leq2$, preferably $0.001\leq x\leq0.4$, particularly preferably $0.01\leq x\leq0.2$ applies.

According to at least one embodiment, the phosphor or the red-emitting phosphor consists of an $Eu^{2+}$-doped nitridoaluminate phosphor of the empirical formula $M_{4-x}Eu_xLiAl_{11}N_{14}$. The red-emitting phosphor thus comprises just one phase. It is, however, also possible for a further phase consisting of AlN to be present.

According to at least one embodiment, the phosphor or the red-emitting phosphor comprises different phases, in particular one phase of the $Eu^{2+}$-doped nitridoaluminate phosphor of the empirical formula $Sr_{4-x}Eu_xLiAl_{11}N_{14}$ and one phase of the phosphor of the empirical formula $SrLiAl_3N_4:Eu^{2+}$ or the red-emitting phosphor consists of these phases and/or phosphors.

In one embodiment, in the X-ray powder diffractogram using Cu—$K_{\alpha1}$ radiation, the phosphor or the red-emitting phosphor, in particular the $Eu^{2+}$-doped nitridoaluminate phosphor, comprises two characteristic reflections in an angular range of 11.5-12.5° 2θ and an angular range of 18.5-19.5° 2θ. The X-ray diffraction data were recorded by means of flat sample holders on a powder diffractometer (PANalytical Empyrean) with X-Celerator CCD detector in Bragg-Brentano geometry. The known phosphor $SrLiAl_3N_4$: $Eu^{2+}$ (WO 2013/175336 A1 and Nature Materials 2014, P. Pust et al., "Narrow-band red emitting $Sr[LiAl_3N_4]:Eu^{2+}$ as a next-generation LED-phosphor material") does not have these reflections.

Compared with the known phosphor of formula $SrLiAl_3N_4:Eu^{2+}$, the red-emitting phosphor, in particular the $Eu^{2+}$-doped nitridoaluminate phosphor, has a higher quantum efficiency. To measure quantum efficiency, i.e., the ratio between the number of emitted and absorbed photons, the red-emitting phosphor according to the invention and the known phosphor of formula $SrLiAl_3N_4:Eu^{2+}$ were each pressed into powder tablets and the relative quantum efficiency compared with the standard phosphor $YAG:Ce^{3+}$ (yttrium aluminum garnet doped with cerium) was determined under identical conditions on a Fluoromax spectrometer. The known phosphor was in this case produced under comparable conditions to the method indicated in Nature Materials 2014, P. Pust et al. The phosphors were characterized by a Rietveld analysis based on X-ray powder diffractograms. When measured relative to a standard phosphor $YAG:Ce^{3+}$, the red-emitting phosphor according to the invention surprisingly has a 15% higher relative quantum efficiency compared with the known phosphor $SrLiAl_3N_4$: $Eu^{2+}$.

In one embodiment, the red-emitting phosphor has an emission maximum, i.e., a peak wavelength, in the range from 620 to 680 nm, preferably in the range from 640 and 680 nm, particularly preferably in the range from 660 to 680 nm. The emission thus lies in the dark red region of the spectrum of the electromagnetic spectrum. In particular, the phosphor according to this embodiment has the empirical formula $M_{4-x}Eu_xLiAl_{11}N_{14}$, wherein M=Ca, Sr and/or Ba, and $0<x\leq2$ or comprises this compound as inorganic compound or the $Eu^{2+}$-doped nitridoaluminate phosphor.

In one embodiment, the red-emitting phosphor with a peak wavelength in the range from 620 to 680 nm has a half-value width (FWHM) of less than 90 nm, preferably less than 70 nm, particularly preferably less than 65 nm and particularly preferably less than 60 nm. Such a small half-value width enables the phosphor according to the invention to emit only or almost only radiation in the visible region of the electromagnetic spectrum, so meaning that no or only slight losses in efficiency arise through emission in the non-visible region of the electromagnetic spectrum. In comparison, the known phosphors $(Sr,Ba)_2Si_5N_8:Eu^{2+}$ have a half-value width of greater than 90 nm, $(Sr,Ca)AlSiN_3:Eu^{2+}$ a half-value width of greater than 70 nm and $SrLiAl_3N_4$: $Eu^{2+}$ a half-value width of greater than or equal to 48 nm. Relative to the phosphor $SrLiAl_3N_4:Eu^{2+}$, however, the phosphor according to the invention has a detectably higher quantum efficiency.

In one embodiment, the phosphor or the red-emitting phosphor emits no or only little radiation outside the visible region of the spectrum. Thus, all or virtually all the emitted photons lie within the sensitivity range of the human eye, which eliminates or minimizes the losses in efficiency through emission in the non-visible region of the electromagnetic spectrum. In this way, high luminescence efficiency is achieved.

In one embodiment, the phosphor or the red-emitting phosphor is produced from starting materials which comprise $Li_3N$, $LiAlH_4$, AlN, $Sr_3N_2$ and $EuF_3$ or $Li_3N$, $LiAlH_4$, AlN, $Sr_3N_2$, $SrH_2$ and $EuF_3$. The phosphor may also be produced to consist of these starting materials. It has surprisingly been found that the phosphor or red-emitting phosphor according to the invention may be produced with a high quantum efficiency from these starting materials. Experiments have shown that the presence of the starting materials $Li_3N$ and $LiAlH_4$ are essential to the production of the phosphor according to the invention. If just one of these starting materials is used, the X-ray powder diffractogram does not exhibit the characteristic reflections in the angular range of 11.5-12.5° 2θ and in the angular range of 18.5-19.5° 2θ. In particular, the phosphor or the inorganic compound then does not have a crystal structure with the same atomic sequence as in $K_2Zn_6O_7$.

In one embodiment, the red-emitting phosphor has a dominant wavelength of λ>620 nm.

In one embodiment, the phosphor or the red-emitting phosphor is excitable by radiation in the UV region to the blue region of the electromagnetic spectrum. For example, the phosphor or the red-emitting phosphor is excitable by radiation with a wavelength of 240 nm to 500 nm, preferably 400 nm to 500 nm, for example, of 460 nm. Compared to the known phosphor $SrLiAl_3N_4:Eu^{2+}$, the phosphor according to the invention or the red-emitting phosphor has a higher absorption in the range from 450 nm to 500 nm.

The stated embodiments of the phosphor or of the red-emitting phosphor may be produced according to the method stated below. All the features described for the phosphor thus also apply to the method for the production thereof and vice versa.

A method is provided for producing a phosphor.

According to at least one embodiment, the phosphor comprises an inorganic compound, which comprises at least one activator E and N and/or O in its empirical formula. The activator E is here from a group comprising Mn, Cr, Ni, Ce, Pr, Nd, Sm, Eu, Tb, Dy, Ho, Er, Yb, Tm, Li, Na, K, Rb, Cs and combinations thereof.

According to at least one embodiment, the phosphor is a red-emitting phosphor comprising an $Eu^{2+}$-doped nitridoaluminate phosphor or consisting of an $Eu^{2+}$-doped nitridoaluminate phosphor.

According to one embodiment, in the X-ray powder diffractogram using Cu—$K_{\alpha 1}$ radiation, the phosphor or the red-emitting phosphor has two characteristic reflections in the angular range from 11.5-12.5° 2θ and in the range from 18.5-19.5° 2θ.

According to one embodiment, the inorganic compound or the $Eu^{2+}$-doped nitridoaluminate phosphor crystallizes in a crystal structure with the same atomic sequence as in $K_2Zn_6O_7$. The crystal structure may in particular be described in the orthorhombic space group Pnnm. In particular, the lattice parameters in the orthorhombic description with the space group Pnnm are a=10.4291(7) Å, b=10.4309(7) Å and c=3.2349(2) and α=β=γ=90°. Alternatively, the crystal structure may be described in a tetragonal crystal system due to twinning and pseudosymmetry. Descriptions in other space groups are also possible.

According to one embodiment, the inorganic compound or the $Eu^{2+}$-doped nitridoaluminate phosphor has the empirical formula $M_{4-x}Eu_xLiAl_{11}N_{14}$, wherein M=Ca, Sr and/or Ba, and 0<x≤2, preferably 0.001≤x≤0.4, particularly preferably 0.01≤x≤0.2 applies. $Eu^{2+}$ ions in this case in particular replace M and occupy the lattice sites of M. The $Eu^{2+}$-doped nitridoaluminate phosphor with the empirical formula $M_{4-x}Eu_xLiAl_{11}N_{14}$ preferably crystallizes in a crystal structure with the same atomic sequence as in $K_2Zn_6O_7$.

According to at least one embodiment, the inorganic compound or the $Eu^{2+}$-doped nitridoaluminate phosphor has the empirical formula $Sr_{4-x}Eu_xLiAl_{11}N_{14}$ and 0<x≤0.4, preferably 0.01≤x≤2, particularly preferably 0.01≤x≤0.2 applies.

According to at least one embodiment, the phosphor or the red-emitting phosphor consists of an $Eu^{2+}$-doped nitridoaluminate phosphor of the empirical formula $M_{4-x}Eu_xLiAl_{11}N_{14}$. The phosphor or the red-emitting phosphor thus comprises just one phase. It is, however, also possible for a further phase consisting of AlN to be present.

According to at least one embodiment, the phosphor or the red-emitting phosphor comprises different phases, in particular one phase of the $Eu^{2+}$-doped nitridoaluminate phosphor of the empirical formula $Sr_{4-x}Eu_xLiAl_{11}N_{14}$ and one phase of the phosphor of the empirical formula $SrLiAl_3N_4:Eu^{2+}$ or the phosphor or the red-emitting phosphor consists of these phases and/or phosphors.

The method comprises the following method steps: A) mixing the starting materials comprising or consisting of $Li_3N$, $LiAlH_4$, $M_3N_2$, AlN and $EuF_3$ or comprising or consisting of $Li_3N$, $LiAlH_4$, $M_3N_2$, $MH_2$, AlN and $EuF_3$, wherein M=Sr, Ca and/or Ba, B) heating the mixture obtained in A) to a temperature T1 of between 900 and 1400° C., and C) annealing the mixture at a temperature T1 of 900 to 1400° C. for five minutes to six hours.

According to one embodiment, the method comprises the following method steps: A) mixing the starting materials comprising or consisting of $Li_3N$, $LiAlH_4$, $Sr_3N_2$, AlN and $EuF_3$ or comprising or consisting of $Li_3N$, $LiAlH_4$, $Sr_3N_2$, $SrH_2$, AlN and $EuF_3$, B) heating the mixture obtained in A) to a temperature T1 of between 900 and 1400° C., and C) annealing the mixture at a temperature T1 of 900 to 1400° C. for five minutes to six hours.

It has surprisingly been found that the phosphor or the red-emitting phosphor according to the invention may be produced from the starting materials $Li_3N$, $LiAlH_4$, $Sr_3N_2$, AlN and $EuF_3$ or $Li_3N$, $LiAlH_4$, $Sr_3N_2$, $SrH_2$, AlN and $EuF_3$. Experiments have shown that the presence of the starting materials $Li_3N$ and $LiAlH_4$ is essential to the production of the phosphor or the red-emitting phosphor according to the invention. If just one of these starting materials is used, the X-ray powder diffractogram does not exhibit the characteristic reflections in the angular range of 11.5-12.5° 2θ and in the angular range of 18.5-19.5° 2θ. In other words, the phosphor according to the invention or the red-emitting phosphor according to the invention does not form if $Li_3N$ and $LiAlH_4$ are not used as starting materials. The phosphor produced in this way surprisingly has a high quantum efficiency.

According to at least one embodiment, $Li_2O$, $SiO_2$, ZnO, MgO, $Li_2CO_3$, $Si_3N_4$ and/or $Zn_3N_2$ may be used as additional starting materials.

In one embodiment, the starting materials are present as a powder.

According to at least one embodiment, the method comprises the following method steps: A) mixing the starting materials comprising or consisting of $Li_3N$, $LiAlH_4$, $M_3N_2$, AlN and $EuF_3$ or comprising or consisting of $Li_3N$, $LiAlH_4$, $M_3N_2$, $MH_2$, AlN and $EuF_3$, wherein M=Sr, Ca and/or Ba, B) heating the mixture obtained in A) to a temperature T1 of between 1000 and 1400° C., and C) annealing the mixture at a temperature T1 of 1000° C. to 1400° C., preferably of 1300° C. to 1400° C., for example, at 1400° C. for five minutes to one hour, for example, 15 minutes. If, in particular, the starting materials consisting of $Li_3N$, $LiAlH_4$, $M_3N_2$, $MH_2$, AlN and $EuF_3$ are used, the inventors have surprisingly established that the phosphor or red-emitting phosphor formed predominantly comprises the $Eu^{2+}$-doped nitridoaluminate phosphor of the empirical formula $M_{4-x}Eu_xLiAl_{11}N_{14}$ or consists of this phosphor. M=Sr is preferred.

In one embodiment, the molar ratio of $LiAlH_4:Li_3N$ is between 5:1 and 1:1, preferably between 4:1 and 1:1, for example, is 1:1 or 3:1. In particular, this molar ratio is present if the red-emitting phosphor is produced from the starting material consisting of $Li_3N$, $LiAlH_4$, $Sr_3N_2$, AlN and $EuF_3$. In this case in particular, the phosphor or the red-emitting phosphor may form comprising one phase of the $Eu^{2+}$-doped nitridoaluminate phosphor of the empirical formula $Sr_{4-x}Eu_xLiAl_{11}N_{14}$ and one phase of the phosphor of the empirical formula $SrLiAl_3N_4:Eu^{2+}$.

In one embodiment, T1 is between 1100 and 1300° C., for example, at 1250° C., and the annealing in method step C) proceeds for one hour to five hours.

In one embodiment, method step C) is followed by a further method step: D) cooling the mixture to a temperature T2, wherein room temperature<T2<T1 applies. Room temperature is understood to mean 20° C.

In one embodiment, method step D) is followed by a further method step: E) annealing the mixture at a temperature T2 of 800 to 1300° C. for five minutes to two hours. Annealing preferably proceeds for five minutes to 60 minutes, particularly preferably for 10 minutes to 30 minutes. In particular if the method steps D) and E) take place, the annealing in method step C) may proceed for five minutes to two hours, preferably for five minutes to 60 minutes, particularly preferably for 10 minutes to 30 minutes.

In one embodiment, T2 is between 800° C. and 1300° C., preferably between 900° C. and 1200° C., particularly preferably between 950° C. and 1100° C., for example, at 1000° C.

In one embodiment, T1=1250° C. and T2=1000° C. In this embodiment the annealing in method steps C) and E) may proceed in each case for 10 minutes to 30 minutes, for example, in each case for 15 minutes.

In one embodiment, method step C) or E) is followed by a further method step: F) cooling mixture to room temperature.

In one embodiment, cooling of the mixture to room temperature in method step F) proceeds at a cooling rate of 100 to 400° C. per hour, preferably 150 to 300° C. per hour, particularly preferably 220 to 270° C. per hour, for example, at a cooling rate of 250° C. per hour.

In one embodiment, cooling of the mixture to T2 in method step D) proceeds at a cooling rate of 100 to 400° C. per hour, preferably 100 to 300° C. per hour, particularly preferably 150 to 200° C. per hour, for example, at a cooling rate of 170° C. per hour.

In one embodiment, method steps B), C), D), E) and/or F) proceed under a forming gas atmosphere. The forming gas preferably has a nitrogen:hydrogen ratio of 92.5:7.5.

In one embodiment, method steps B), C), D), E) and/or F) take place in a tube furnace.

In one embodiment, the heating in method step B) proceeds at a heating rate of 100 to 400° C. per hour, particularly preferably of 150 to 300° C. per hour, particularly preferably of 200 to 250° C. per hour, for example, at a heating rate of 250° C. per hour.

In one embodiment, the starting materials are used in a molar ratio of $AlN:Sr_3N_2:Li_3N:LiAlH_4:EuF_3 = 1:0.05-0.3: 0.05-0.2:0.05-0.4:0.0001-0.009$. The starting materials are preferably used in a molar ratio of $AlN:Sr_3N_2:Li_3N:LiAlH_4: EuF_3=1:0.1-0.2:0.05-0.1:0.05-0.3:0.001-0.003$, particularly preferably in a molar ratio of $AlN:Sr_3N_2:Li_3N:LiAlH_4: EuF_3=1:0.1-0.15:0.06-0.1:0.08-0.2:0.001-0.002$. Under these molar ratios in particular, the phosphor or the red-emitting phosphor may form comprising one phase of the $Eu^{2+}$-doped nitridoaluminate phosphor of the empirical formula $Sr_{4-x}Eu_xLiAl_{11}N_{14}$ and one phase of the phosphor of the empirical formula $SrLiAl_3N_4:Eu^{2+}$.

It has been found that by varying the temperature Ti, the temperature T2, the duration of method step C), the duration of method step E) and/or the molar ratios of the starting materials, it is possible to control the half-value width of the red-emitting phosphor; if in particular $Li_3N$, $LiAlH_4$, $Sr_3N_2$, AlN and $EuF_3$ are used as starting materials, the composition of the red-emitting phosphor may be varied by selecting the temperature and the duration of method step C).

It has furthermore been found that it is possible to influence the composition of the red-emitting phosphor by varying the temperature Ti, the duration of method step C), and/or the molar ratios of the starting materials or by selecting the starting materials. In particular, if the starting materials consisting of $Li_3N$, $LiAlH_4$, $M_3N_2$, $MH_2$, AlN and $EuF_3$ are used and in method step C) annealing of the mixture proceeds at a temperature T1 of 1000° C. to 1400° C., preferably of 1300° C. to 1400° C., for example, of 1400° C. for five minutes to one hour, the phosphor formed or the red-emitting phosphor predominantly comprises the $Eu^{2+}$-doped nitridoaluminate phosphor of empirical formula $M_{4-x}Eu_xLiAl_{11}N_{14}$ or consists of this phosphor.

The stated embodiments of the phosphor or the red-emitting phosphor may be used for the following stated uses. The features of the phosphor are also disclosed for the use thereof and vice versa.

Use of a phosphor for the conversion of light into longer-wave light is provided. This may be understood to mean that light is absorbed by the phosphor and emitted as light with a longer wavelength.

Use of a red-emitting phosphor for the conversion of light into longer-wave, red light is further provided. This may be understood to mean that light is absorbed by the red-emitting phosphor and emitted as light with a longer wavelength located in the red region of the spectrum.

According to one embodiment, use of a phosphor or of a red-emitting phosphor in a conversion element is provided.

According to at least one embodiment, the phosphor comprises an inorganic compound, which comprises at least one activator E and N and/or O in its empirical formula. The activator E is here from a group comprising Mn, Cr, Ni, Ce, Pr, Nd, Sm, Eu, Tb, Dy, Ho, Er, Yb, Tm, Li, Na, K, Rb, Cs and combinations thereof.

According to at least one embodiment, the phosphor is a red-emitting phosphor comprising an $Eu^{2+}$-doped nitridoaluminate phosphor or consisting of an $Eu^{2+}$-doped nitridoaluminate phosphor.

According to one embodiment, in the X-ray powder diffractogram using $Cu-K_{\alpha 1}$ radiation, the phosphor has two characteristic reflections in an angular range of 11.5-12.5° 2θ and in an angular range of 18.5-19.5° 2θ.

According to one embodiment, the inorganic compound or the $Eu^{2+}$-doped nitridoaluminate phosphor crystallizes in a crystal structure with the same atomic sequence as in $K_2Zn_6O_7$. The crystal structure may in particular be described in the orthorhombic space group Pnnm. In particular, the lattice parameters in the orthorhombic description with the space group Pnnm are a=10.4291(7) Å, b=10.4309(7) Å and c=3.2349(2) and α=β=γ=90°. Alternatively, the crystal structure may be described in a tetragonal crystal system due to twinning and pseudosymmetry. Descriptions in other space groups are also possible.

According to one embodiment, the inorganic compound or the $Eu^{2+}$-doped nitridoaluminate phosphor has the empirical formula $M_{4-x}Eu_xLiAl_{11}N_{14}$, wherein M=Ca, Sr and/or Ba, and 0<x≤2, preferably 0.001≤x≤0.4, particularly preferably 0.01≤x≤0.2 applies. $Eu^{2+}$ ions in this case in particular replace M and occupy the lattice sites of M. The $Eu^{2+}$-doped nitridoaluminate phosphor with the empirical formula $M_{4-x}Eu_xLiAl_{11}N_{14}$ preferably crystallizes in a crystal structure with the same atomic sequence as in $K_2Zn_6O_7$.

According to at least one embodiment, the $Eu^{2+}$-doped nitridoaluminate phosphor has the empirical formula $Sr_{4-x}Eu_xLiAl_{11}N_{14}$ and 0<x≤2, preferably 0.001≤x≤0.4, particularly preferably 0.01≤x≤0.2 applies.

According to at least one embodiment, the phosphor or the red-emitting phosphor consists of an $Eu^{2+}$-doped nitridoaluminate phosphor of the empirical formula $M_{4-x}Eu_xLiAl_{11}N_{14}$. The phosphor or the red-emitting phosphor thus comprises just one phase. It is, however, also possible for a further phase consisting of AlN to be present.

According to at least one embodiment, the phosphor or the red-emitting phosphor comprises different phases, in particular one phase of the $Eu^{2+}$-doped nitridoaluminate phosphor of the empirical formula $Sr_{4-x}Eu_xLiAl_{11}N_{14}$ and one phase of the phosphor of the empirical formula $SrLiAl_3N_4:Eu^{2+}$ or the red-emitting phosphor consists of these phases and/or phosphors.

In one embodiment of the use, the phosphor or the red-emitting phosphor is used for the conversion of blue light into longer-wave, red light. For example, the blue light has a wavelength of 400 nm to 500 nm.

In one embodiment of the use, the conversion element is comprised by a light-emitting diode (LED).

In one embodiment of the use, the LED comprises a semiconductor chip which, when in operation, emits blue radiation in a wavelength range from 400 nm to 500 nm, for example, at 460 nm. A semiconductor chip which is suitable for emitting blue radiation when in operation is based, for example, on gallium nitride or indium gallium nitride.

The LED preferably emits white light. In this embodiment, the conversion element may additionally comprise a phosphor which emits radiation in the green region of the electromagnetic spectrum.

The stated embodiments of the phosphor or of the red-emitting phosphor may be used in a conversion element of a light-emitting diode.

A light-emitting diode is provided. This comprises a semiconductor chip which, when the device is in operation, emits blue radiation in a wavelength range from 400 nm to 500 nm and a conversion element comprising a red-emitting phosphor, which comprises an $Eu^{2+}$-doped nitridoaluminate phosphor.

According to one embodiment, in the X-ray powder diffractogram using $Cu-K_{\alpha 1}$ radiation, the phosphor or the red-emitting phosphor has two characteristic reflections in an angular range of 11.5-12.5° 2θ and in an angular range of 18.5-19.5° 2θ. The red-emitting phosphor is configured to convert the radiation emitted by the semiconductor chip into secondary radiation of a wavelength of between 620 nm and 680 nm when the light-emitting diode is in operation.

According to one embodiment, the inorganic compound or the $Eu^{2+}$-doped nitridoaluminate phosphor crystallizes in a crystal structure with the same atomic sequence as in $K_2Zn_6O_7$. The crystal structure may in particular be described in the orthorhombic space group Pnnm. In particular, the lattice parameters in the orthorhombic description with the space group Pnnm are a=10.4291(7) Å, b=10.4309(7) Å and c=3.2349(2) and α=β=γ=90°. Alternatively, the crystal structure may be described in a tetragonal crystal system due to twinning and pseudosymmetry. Descriptions in other space groups are also possible.

According to one embodiment, the $Eu^{2+}$-doped nitridoaluminate phosphor has the empirical formula $M_{4-x}Eu_xLiAl_{11}N_{14}$, wherein M=Ca, Sr and/or Ba, and 0<x≤2, preferably 0.001≤x≤0.4, particularly preferably 0.01≤x≤0.2 applies. $Eu^{2+}$ ions in this case in particular replace M and occupy the lattice sites of M. The $Eu^{2+}$-doped nitridoaluminate phosphor with the empirical formula $M_{4-x}Eu_xLiAl_{11}N_{14}$ preferably crystallizes in a crystal structure with a comparable atomic sequence as in $K_2Zn_6O_7$.

According to at least one embodiment, the $Eu^{2+}$-doped nitridoaluminate phosphor has the empirical formula $Sr_{4-x}Eu_xLiAl_{11}N_{14}$ and 0<x≤2, preferably 0.001≤x≤0.4, particularly preferably 0.01≤x≤0.2 applies.

According to at least one embodiment, the phosphor or the red-emitting phosphor consists of an $Eu^{2+}$-doped nitridoaluminate phosphor of the empirical formula $M_{4-x}Eu_xLiAl_{11}N_{14}$. The red-emitting phosphor thus comprises just one phase. It is, however, also possible for a further phase consisting of AlN to be present.

According to at least one embodiment, the red-emitting phosphor comprises different phases, in particular one phase of the $Eu^{2+}$-doped nitridoaluminate phosphor of the empirical formula $Sr_{4-x}Eu_xLiAl_{11}N_{14}$ and one phase of the phosphor of the empirical formula $SrLiAl_3N_4:Eu^{2+}$ or the red-emitting phosphor consists of these phases and/or phosphors.

One possible embodiment of the conversion element is an embodiment in the form of a potting compound, wherein the potting compound encloses the semiconductor chip in form-fitting manner. Furthermore, the potting compound enclosing the semiconductor chip in form-fitting manner may be stabilized at the side walls, for example, by a package and is located, for example, in a recess in such a package. Materials for the potting compound are known to a person skilled in the art.

The conversion element may moreover take the form of a conversion layer. In the case of the conversion layer, there is direct contact between conversion layer and semiconductor chip, wherein the thickness of the conversion layer may, for example, be less than the thickness of the semiconductor chip and may, for example, be constant at all radiation exit faces.

The conversion element may furthermore assume the shape of a plate or a film. The plate or the film is arranged over the semiconductor chip. In these further variant embodiments of the conversion element, there is not necessarily any direct and/or form-fitting contact between the conversion element and the semiconductor chip. That is to say, there may be a gap between the conversion element and the semiconductor chip. In other words, the conversion element is arranged downstream of the semiconductor chip and is irradiated by the emitted radiation of the semiconductor chip. A potting body or an air gap may then be formed between conversion element and semiconductor chip.

According to one embodiment, the light-emitting diode may be used for backlighting.

BRIEF DESCRIPTION OF THE DRAWINGS

Further advantageous embodiments and further developments of the invention are revealed by the exemplary embodiments described below in conjunction with the figures.

FIGS. 16A, 16B and 16C show characteristic properties of a red-emitting phosphor;

FIGS. 18A and 18B show a selection of possible, electroneutral empirical formulae for substitution experiments.

DETAILED DESCRIPTION OF ILLUSTRATIVE EMBODIMENTS

Figure 1:
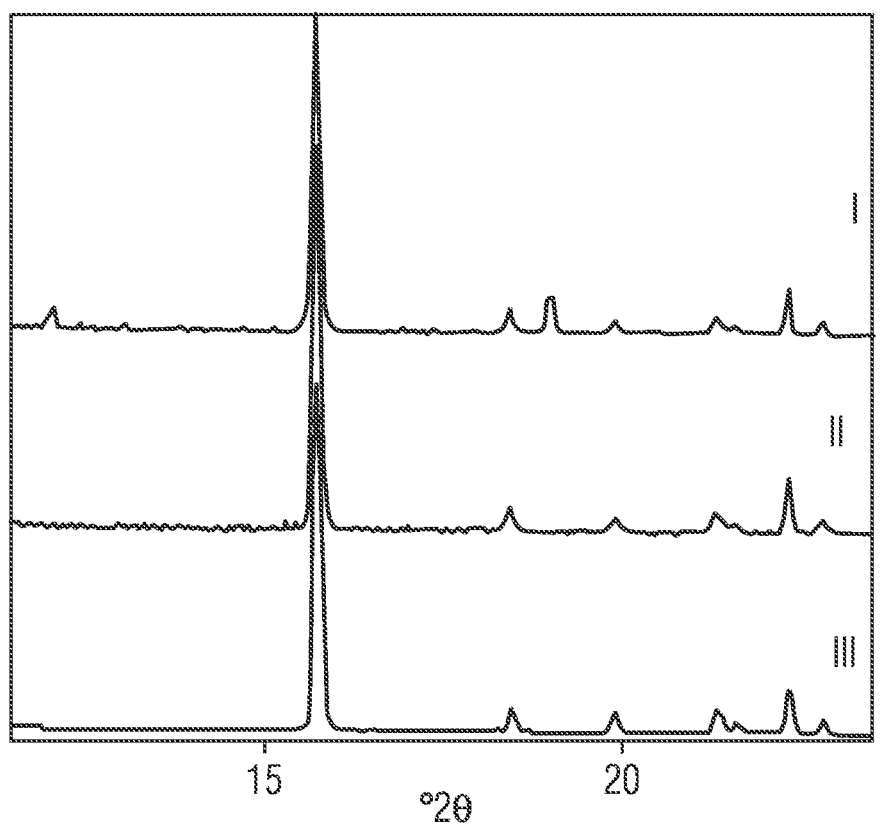
FIGS. 1, 4 and 7 show X-ray powder diffractograms using copper $K_{\alpha 1}$ radiation of three exemplary embodiments of a red-emitting phosphor.

FIG. 1 shows three X-ray powder diffractograms using copper $K_{\alpha 1}$ radiation. The diffraction angles are plotted on the x axis in ° 2θ values and the intensity is plotted on the y axis. The X-ray powder diffractogram provided with reference sign I shows that of a first exemplary embodiment of the red-emitting phosphor according to the invention. It has two characteristic reflections in an angular range of 11.5-12.5° 2θ and in an angular range of 18.5-19.5° 2θ. These characteristic reflections of the red-emitting phosphor according to the invention have a relative intensity compared to the strongest reflection in the X-ray powder diffractogram of over 2% (absolute intensity) or over 1% (integral intensity). The intensity of these reflections is at least three times as great as the average noise in the X-ray powder diffractogram and the reflections are thus significant reflections, which may be associated with the red-emitting phosphor. The X-ray powder diffractogram provided with reference sign II corresponds to that of the known phosphor of formula $SrLiAl_3N_4:Eu^{2+}$. As is apparent, this known phosphor does not show the characteristic reflections of the red-emitting phosphor according to the invention in the angular range of 11.5-12.5° 2θ and in the angular range of 18.5-19.5° 2θ. The X-ray powder diffractogram provided with reference sign III is a simulated diffractogram of a compound of formula $SrLiAl_3N_4$. It is clear from the X-ray powder diffractograms shown that the red-emitting phosphor according to the invention is a phosphor which differs from the known phosphor of formula $SrLiAl_3N_4:Eu^{2+}$. This is also proven by the additional reflections in an angular range of 11.5-12.5° 2θ and in the angular range of 18.5-19.5° 2θ of the red-emitting phosphor according to the invention compared with the known phosphor. The phosphor according to the invention comprises the known phosphor $SrLiAl_3N_4:Eu^{2+}$ and additionally also one further phase of an $Eu^{2+}$-doped nitridoaluminate phosphor of empirical formula $Sr_{4-x}Eu_xLiAl_{11}N_{14}$.

The first exemplary embodiment of the phosphor according to the invention, which has the X-ray powder diffractogram with the reference sign I in FIG. 1, was produced as follows: 0.0591 mol $Sr_3N_2$, 0.0297 $Li_3N$, 0.089 mol $LiAlH_4$, 0.445 mol AlN and 0.0007 mol $EuF_3$ are mixed together homogeneously. The molar ratio $AlN:Sr_3N_2:Li_3N:LiAlH_4:EuF_3$ is 1:0.1328:0.0667:0.2:0.0016. The mixture is transferred into a tungsten crucible, which is transferred into a tube furnace. Under a forming gas atmosphere ($N_2:H_2=92.5:7.5$) the mixture is heated at a heating rate of 250° C. per hour to a temperature of 1250° C. The mixture is annealed for 15 minutes at a temperature of 1250° C., and then cooling to 1000° C. proceeds at a cooling rate of 170° C. per hour. The mixture is held for 15 minutes at 1000° and then cooled to room temperature at a cooling rate of 250° C. per hour.

Figure 2:
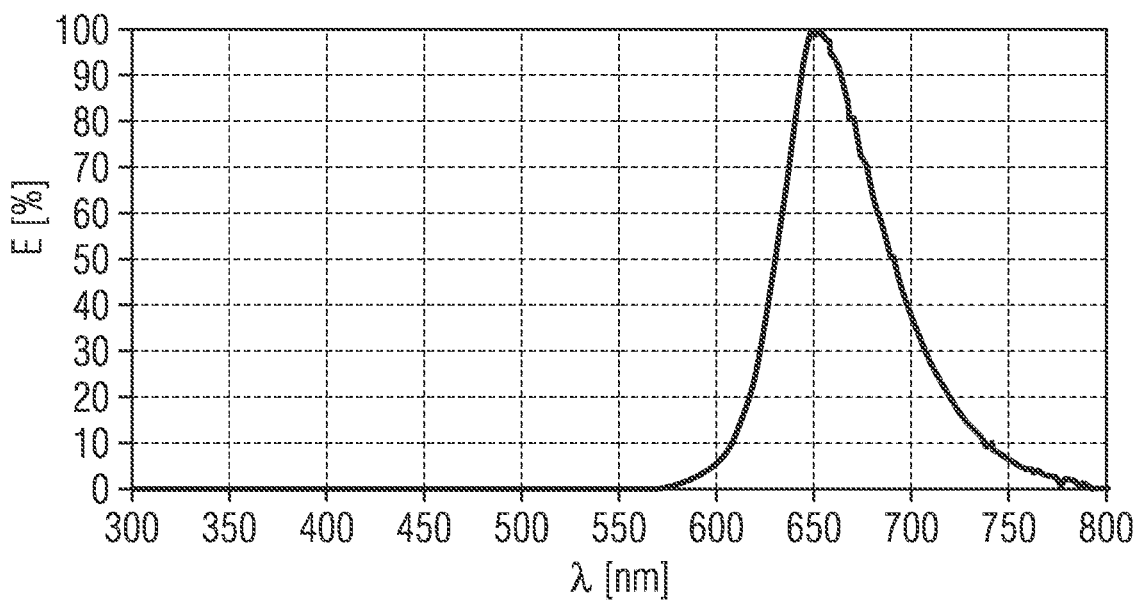
FIGS. 2, 5 and 8 show emission spectra from three exemplary embodiments of a red-emitting phosphor.

FIG. 2 shows the emission spectrum of the first exemplary embodiment of the phosphor according to the invention, which was synthesized as described in relation to FIG. 1. The wavelength in nanometers is plotted on the x axis and the emission intensity in percent is plotted on the y axis. To measure the emission spectrum, the phosphor according to the invention was excited with blue light of a wavelength of 460 nm. The phosphor has a half-value width of 59 nm and a dominant wavelength of 627 nm, the emission maximum being at about 654 nm. Compared with the known phosphors $(Sr,Ba)_2Si_5N_8:Eu^{2+}$ with a half-value width of greater than 90 nm and $(Sr,Ca)AlSiN_3:Eu^{2+}$ with a half-value width of greater than 70 nm, the phosphor according to the invention thus has a smaller half-value width. The phosphor according to the invention thus emits virtually only in the visible range of the electromagnetic spectrum, which leads to a reduction in losses in the IR region. The known phosphor $SrLiAl_3N_4:Eu^{2+}$ has a half-value width of about 50 nm, but in comparison with the phosphor $SrLiAl_3N_4:Eu^{2+}$ the quantum efficiency of the phosphor according to the invention is higher.

Figure 3:
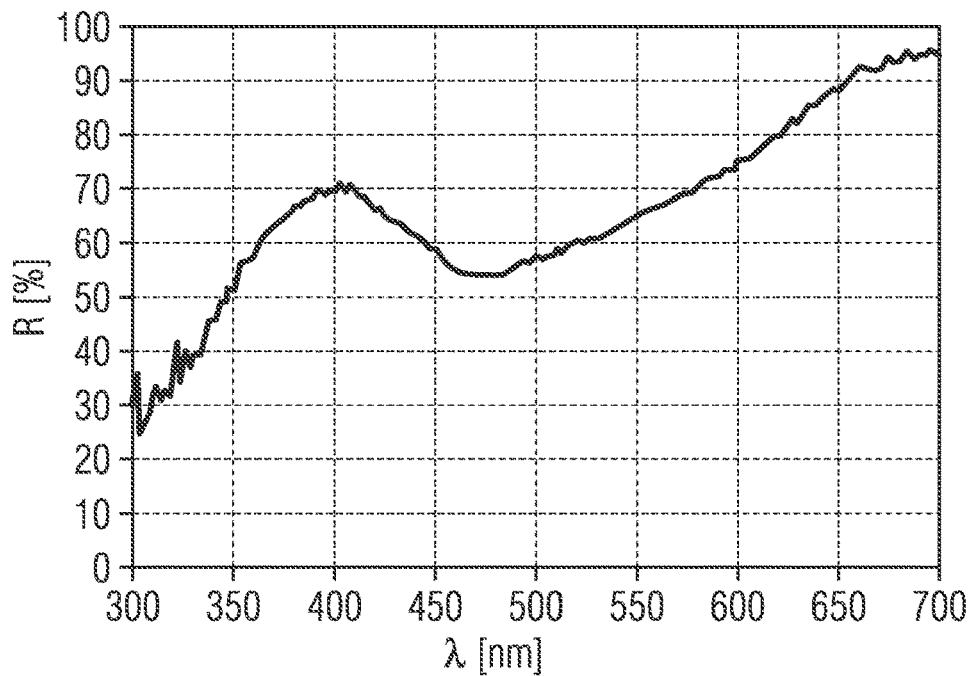
FIGS. 3, 6 and 9 show reflectances from three exemplary embodiments of a red-emitting phosphor.

FIG. 3 shows the reflectance of the first exemplary embodiment of the phosphor according to the invention, which was synthesized as described in relation to FIG. 1, as a function of wavelength. The wavelength in nanometers is plotted on the x axis and the reflectance in percent is plotted on the y axis. As is apparent, the phosphor according to the invention has a minimum reflectance between 450 and 500 nm and is thus best excited with a wavelength of between 450 and 500 nm, since absorption is particularly high at this wavelength. Compared to the known phosphor $SrLiAl_3N_4:Eu^{2+}$, the phosphor according to the invention has a higher absorption in the range from 450 nm to 500 nm.

Figure 4:
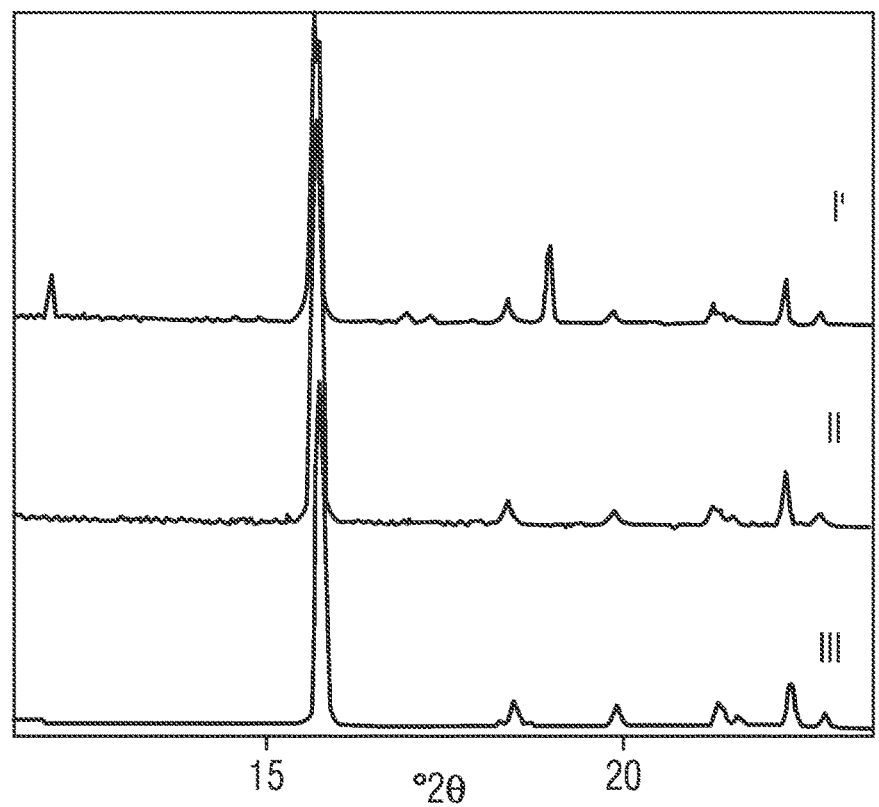

FIG. 4 shows three X-ray powder diffractograms using copper $K_{\alpha 1}$ radiation. The diffraction angles are plotted on the x axis in ° 2θ values and the intensity is plotted on the y axis. The X-ray powder diffractogram provided with reference sign I' shows that of a second exemplary embodiment of the red-emitting phosphor according to the invention. Like the first exemplary embodiment, it has two characteristic reflections in an angular range of 11.5-12.5° 2θ and in an angular range of 18.5-19.5° 2θ. In comparison with the first exemplary embodiment, the intensity of the characteristic reflections is higher. The X-ray powder diffractogram provided with reference sign II shows that of the known phosphor of formula $SrLiAl_3N_4:Eu^{2+}$. As in FIG. 1, it is here also apparent that the known phosphor does not have the characteristic reflections of the phosphor according to the invention in an angular range of 11.5-12.5° 2θ and in an angular range of 18.5-19.5° 2θ. The X-ray powder diffractogram provided with reference sign III is a simulated diffractogram of a compound of formula $SrLiAl_3N_4$.

The second exemplary embodiment of the phosphor according to the invention, the X-ray powder diffractogram of which is shown in FIG. 4 with reference sign I', was produced as follows: 0.0509 mol $Sr_3N_2$, 0.0383 $Li_3N$, 0.0383 mol $LiAlH_4$, 0.4216 mol AlN and 0.0006 mol $EuF_3$ are processed into a homogeneous mixture. The molar ratio $AlN:Sr_3N_2:Li_3N:LiAlH_4:EuF_3$ is 1:0.1207:0.0908:0.0908:0.0014. The mixture is transferred into a tungsten crucible, which is transferred into a tube furnace. Under a forming gas atmosphere ($N_2:H_2=92.5:7.5$), the mixture is heated at a heating rate of 250° C. per hour to a temperature of 1250°, held for one hour at this temperature and then cooled to room temperature at a cooling rate of 250° C. per hour. The phosphor according to the invention of the second exemplary embodiment comprises the known phosphor SrLiAl$_3$N$_4$:Eu$^{2+}$ and additionally also one further phase of an Eu$^{2+}$-doped nitridoaluminate phosphor of empirical formula Sr$_{4-x}$Eu$_x$LiAl$_{11}$N$_{14}$.

Figure 5:
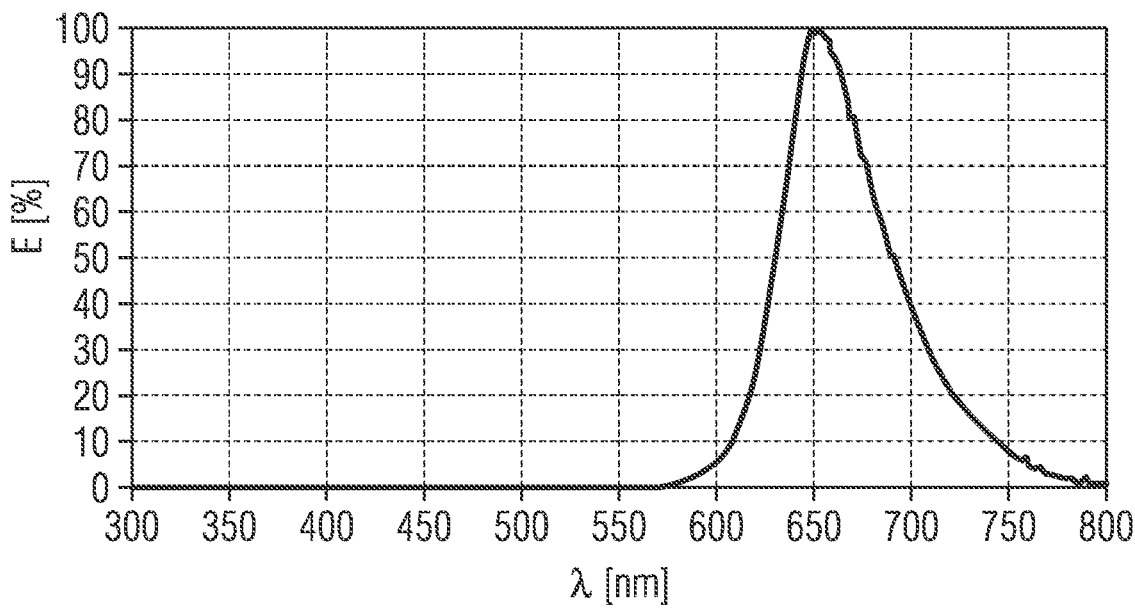

FIG. 5 shows the emission spectrum of the second exemplary embodiment of the phosphor according to the invention, which was synthesized as described in relation to FIG. 4. The wavelength in nanometers is plotted on the x axis and the emission intensity in percent is plotted on the y axis. To measure the emission spectrum, the phosphor according to the invention was excited with blue light of a wavelength of 460 nm. The phosphor has a half-value width of 61 nm and a dominant wavelength of 627 nm, the emission maximum being at about 654 nm.

Figure 6:
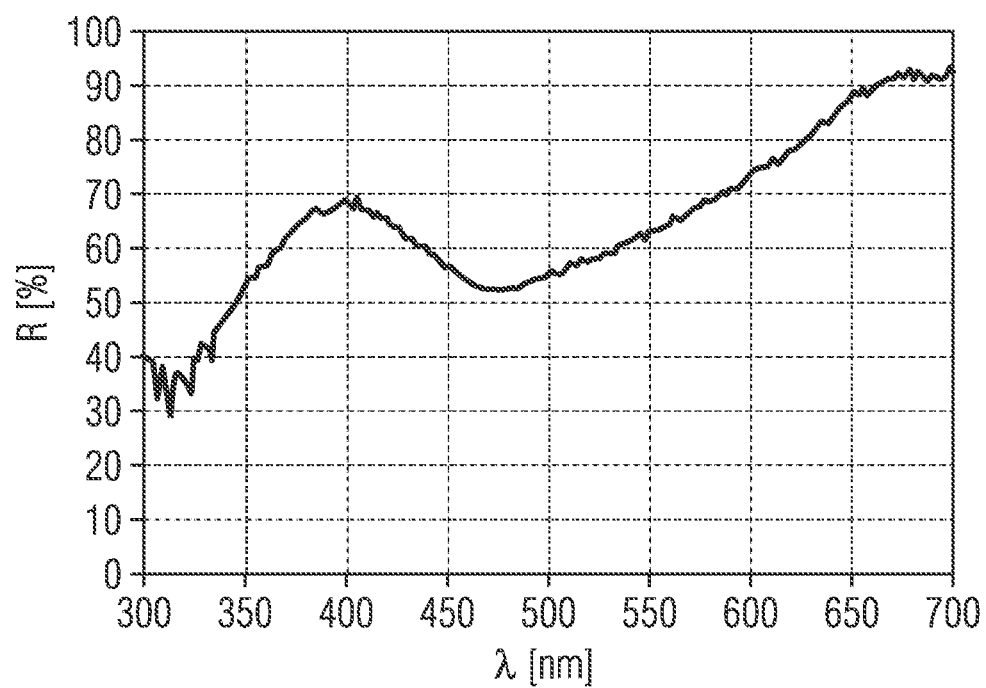

FIG. 6 shows the reflectance of the second exemplary embodiment of the phosphor according to the invention, which was synthesized as described in relation to FIG. 4, as a function of wavelength. The wavelength in nanometers is plotted on the x axis and the reflectance in percent is plotted on the y axis. As is apparent, the phosphor according to the invention has a minimum reflectance between 450 and 500 nm and is thus best excited with a wavelength of between 450 and 500 nm, since absorption is particularly high at this wavelength. In comparison with the known phosphor SrLiAl$_3$N$_4$:Eu$^{2+}$, the second exemplary embodiment of the phosphor according to the invention also has a higher absorption in the range from 450 nm to 500 nm.

Figure 7:
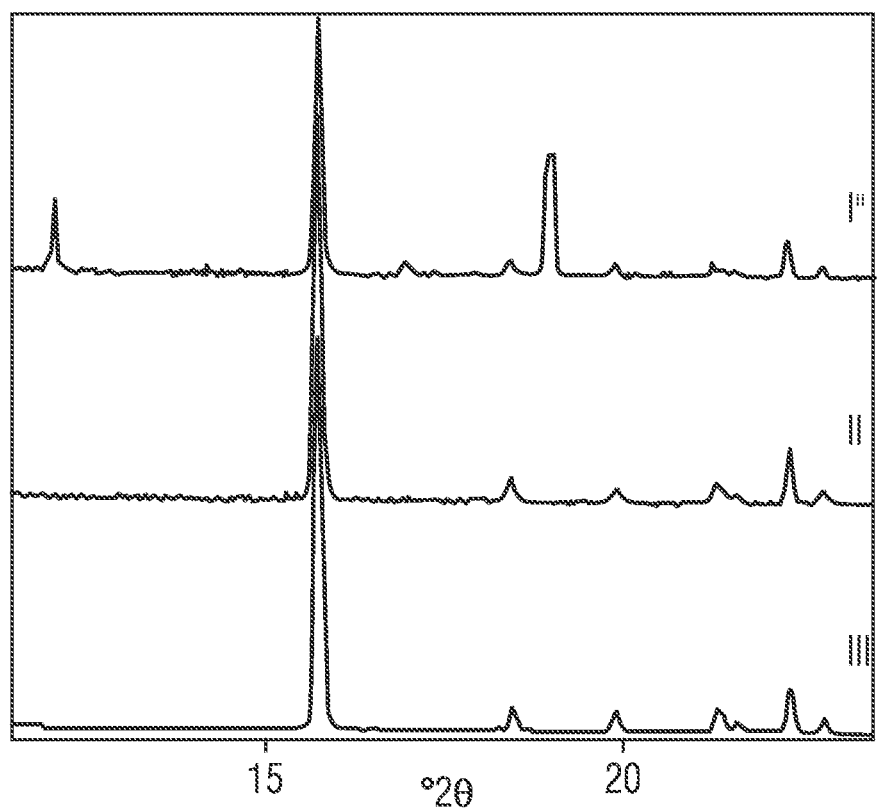

FIG. 7 shows three X-ray powder diffractograms using copper K$_{\alpha 1}$ radiation. The diffraction angles are plotted on the x axis in ° 2θ values and the intensity is plotted on the y axis. The X-ray powder diffractogram provided with reference sign I" shows that of a third exemplary embodiment of the red-emitting phosphor according to the invention. Like the first and second exemplary embodiments, it has two characteristic reflections in an angular range of 11.5-12.5° 2θ and in an angular range of 18.5-19.5° 2θ. In comparison with the first and second exemplary embodiments, the intensity of the characteristic reflections is greater. The X-ray powder diffractogram provided with reference sign II shows that of a phosphor of formula SrLiAl$_3$N$_4$:Eu$^{2+}$. As in FIGS. 1 and 4, it is here also apparent that the known phosphor does not have the characteristic reflections of the phosphor according to the invention in an angular range of 11.5-12.5° 2θ and in the range 18.5-19.5° 2θ. The X-ray powder diffractogram provided with reference sign III is a simulated diffractogram of a compound of formula SrLiAl$_3$N$_4$. The phosphor according to the invention of the third exemplary embodiment comprises the known phosphor SrLiAl$_3$N$_4$:Eu$^{2+}$ and additionally also one further phase of an Eu$^{2+}$-doped nitridoaluminate phosphor of empirical formula Sr$_{4-x}$Eu$_x$LiAl$_{11}$N$_{14}$.

The third exemplary embodiment of the phosphor according to the invention, the X-ray powder diffractogram of which is shown in FIG. 7 with reference sign I", was produced as follows: 0.0591 mol Sr$_3$N$_2$, 0.0297 Li$_3$N, 0.089 mol LiAlH$_4$, 0.445 mol AlN and 0.0007 mol EuF$_3$ were processed into a homogeneous mixture. The molar ratio AlN:Sr$_3$N$_2$:Li$_3$N:LiAlH$_4$:EuF$_3$ is 1:0.1328:0.0667:0.20:0.0016. The mixture is transferred into a tungsten crucible, which is transferred into a tube furnace. Under a forming gas atmosphere (N$_2$:H$_2$=92.5:7.5), the mixture is heated at a heating rate of 250° C. per hour to a temperature of 1250°, held for five hours at this temperature and then cooled to room temperature at a cooling rate of 250° C. per hour.

Figure 8:
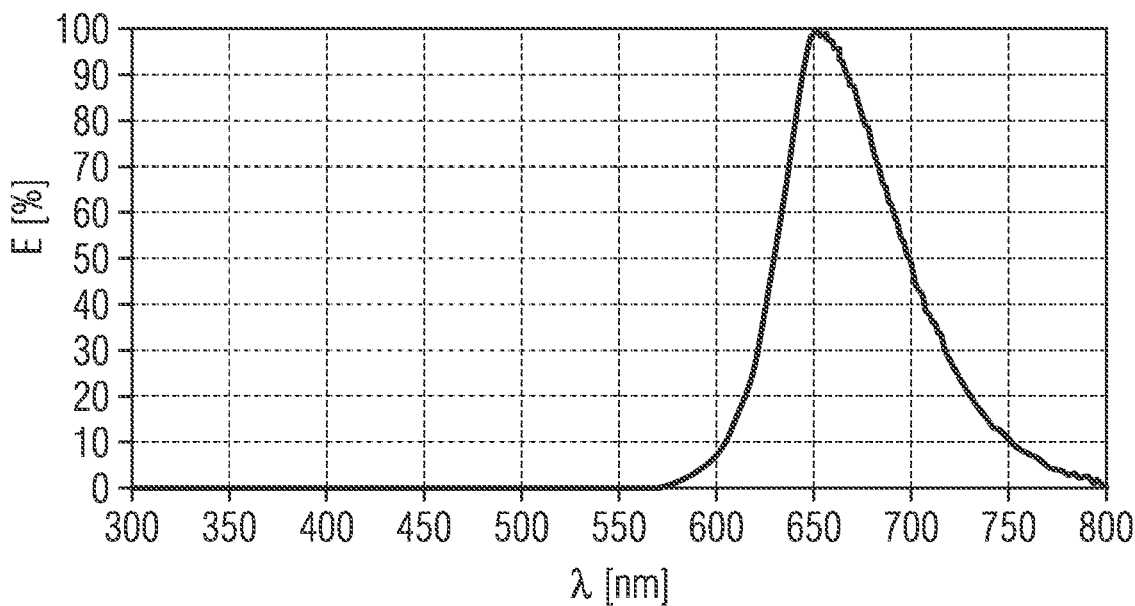

FIG. 8 shows the emission spectrum of the third exemplary embodiment of the phosphor according to the invention, which was synthesized as described in relation to FIG. 7. The wavelength in nanometers is plotted on the x axis and the emission intensity in percent is plotted on the y axis. To measure the emission spectrum, the phosphor according to the invention was excited with blue light of a wavelength of 460 nm. The phosphor has a half-value width of 68 nm and a dominant wavelength of 625 nm, the emission maximum being at about 652 nm.

Figure 9:
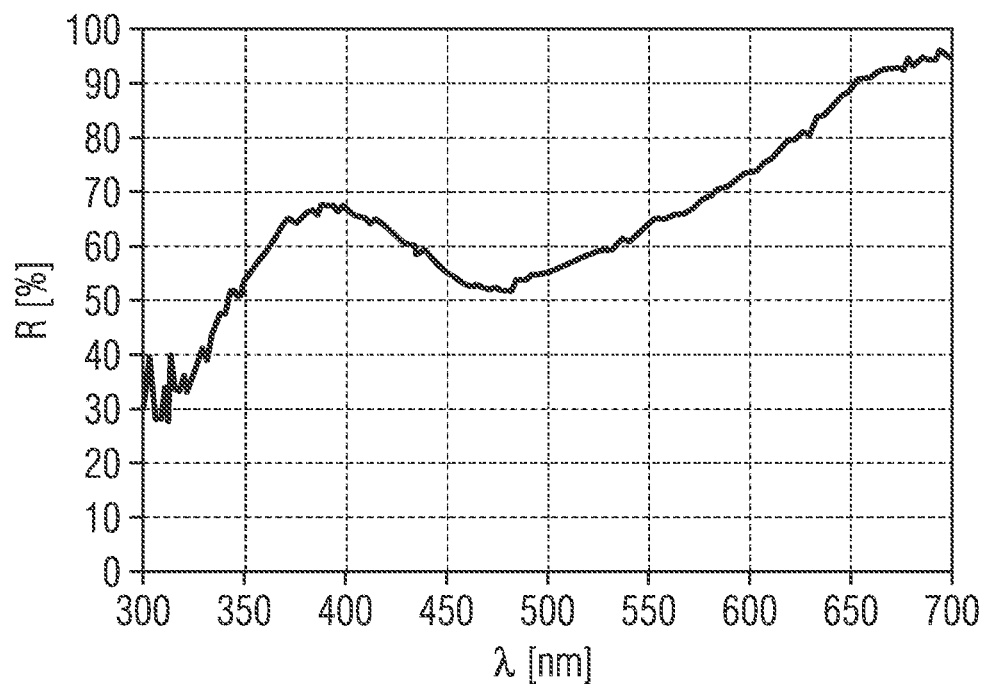

FIG. 9 shows the reflectance of the third exemplary embodiment of the phosphor according to the invention, which was synthesized as described in relation to FIG. 7, as a function of wavelength. The wavelength in nanometers is plotted on the x axis and the reflectance in percent is plotted on the y axis. As is apparent, the phosphor according to the invention has a minimum reflectance between 450 and 500 nm and is thus best excited with a wavelength of between 450 and 500 nm, since absorption is particularly high at this wavelength. In comparison with the known phosphor SrLiAl$_3$N$_4$:Eu$^{2+}$, a higher absorption in the range from 450 nm to 500 nm may also be shown for the third exemplary embodiment of the phosphor according to the invention.

Overall, it is clear from the three exemplary embodiments of the red-emitting phosphor according to the invention that by varying the temperature T1, the duration of method step C) and/or the molar ratios of the starting materials, the half-value width of the red-emitting phosphor or the composition of the red-emitting phosphor may be varied. In summary, the three exemplary embodiments have the following half-value widths and dominant wavelengths:

|  | FWHM/nm | $\lambda_{dom}$/nm |
| --- | --- | --- |
| First exemplary embodiment | 59 | 627 |
| Second exemplary embodiment | 61 | 627 |
| Third exemplary embodiment | 68 | 625 |

Figure 10:
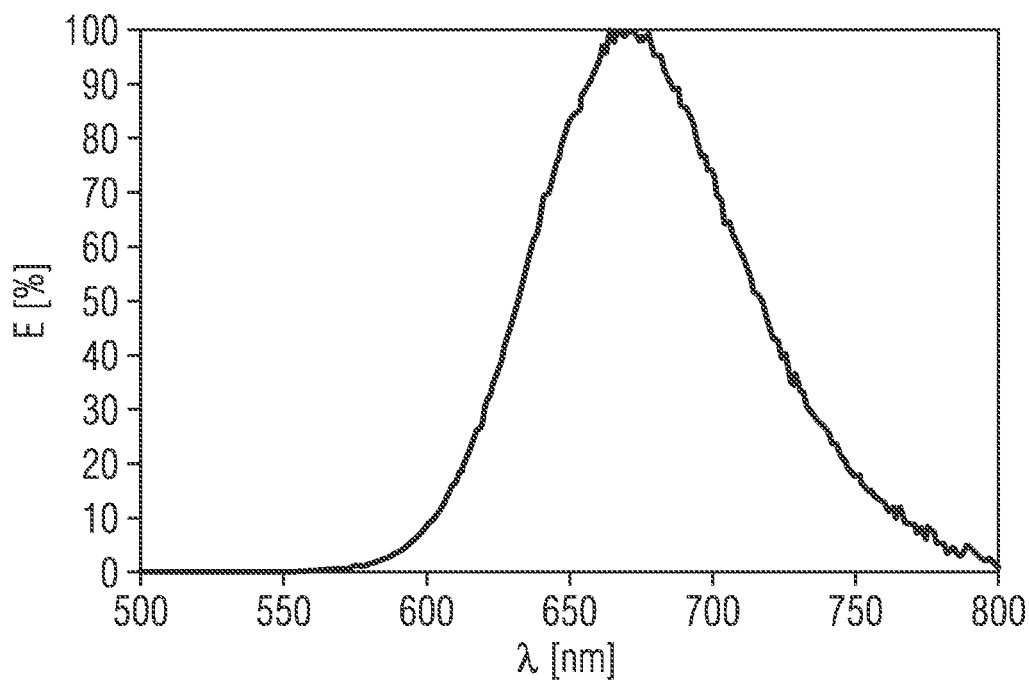
FIG. 10 shows an emission spectrum of an exemplary embodiment of a red-emitting phosphor.

FIG. 10 shows the emission spectrum of a fourth exemplary embodiment of the red-emitting phosphor according to the invention. The wavelength in nanometers is plotted on the x axis and the emission intensity in percent is plotted on the y axis. To measure the emission spectrum, the phosphor according to the invention in the form of a powder tablet was excited with blue light of a wavelength of 460 nm. The phosphor has a half-value width of 85 nm and a dominant wavelength of 623.5 nm, the emission maximum being at 670 nm.

The fourth exemplary embodiment of the phosphor according to the invention was produced as follows: 161.75 mmol Sr$_3$N$_2$, 485.26 mmol SrH$_2$, 828.27 mmol LiAlH$_4$ 48.72 mmol Li$_3$N, 1843.60 mmol AlN and 3.90 mmol EuF$_3$ were processed into a homogeneous mixture. The molar ratio AlN:Sr$_3$N$_2$:SrH$_2$:LiAlH$_4$:Li$_3$N:EuF$_3$ is 1:0.088:0.263:0.449:0.026:0.002. The mixture is transferred into a tungsten crucible, which is in turn transferred into a tube furnace. Under a forming gas atmosphere (N$_2$:H$_2$=92.5:7.5), the mixture is heated at a heating rate of 250° C. per hour to a temperature of 1400°, held for 15 minutes at this temperature and then cooled to room temperature at a cooling rate of 250° C. per hour. The phosphor has the empirical formula Sr$_4$LiAl$_{11}$N$_{14}$:Eu$^{2+}$, wherein Eu$^{2+}$ partly replaces Sr. This can alternatively be written Sr$_{4-x}$Eu$_x$LiAl$_{11}$N$_{14}$. The red-emitting phosphor or the Eu$^{2+}$-doped nitridoaluminate phosphor crystallizes in a crystal structure with the same atomic sequence as in K$_2$Zn$_6$O$_7$. The crystal structure may in particular be described in the orthorhombic space group Pnnm. In particular, the lattice parameters in the orthorhombic description with the space group Pnnm are a=10.4291(7)

Å, b=10.4309(7) Å and c=3.2349(2) and α=β=γ=90°. Descriptions in other space groups are also possible.

Figure 11:
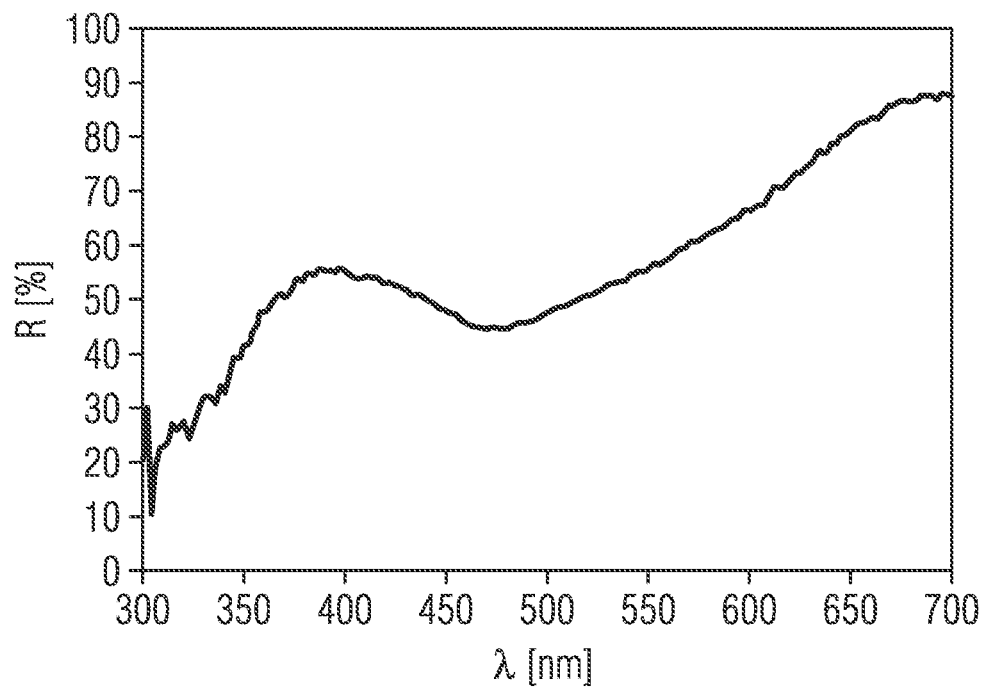
FIG. 11 shows the reflectance of an exemplary embodiment of a red-emitting phosphor.

FIG. 11 shows the reflectance of the fourth exemplary embodiment of the phosphor according to the invention, which was synthesized as described in relation to FIG. 10, as a function of wavelength. The wavelength in nanometers is plotted on the x axis and the reflectance in percent is plotted on the y axis. As is apparent, the phosphor according to the invention has a minimum reflectance between 450 and 500 nm and is thus best excited with a wavelength of between 450 and 500 nm, since absorption is particularly high at this wavelength. In comparison with the known phosphor $SrLiAl_3N_4:Eu^{2+}$, a higher absorption in the range from 450 nm to 500 nm may also be shown for the fourth exemplary embodiment of the phosphor according to the invention.

Figure 12A:
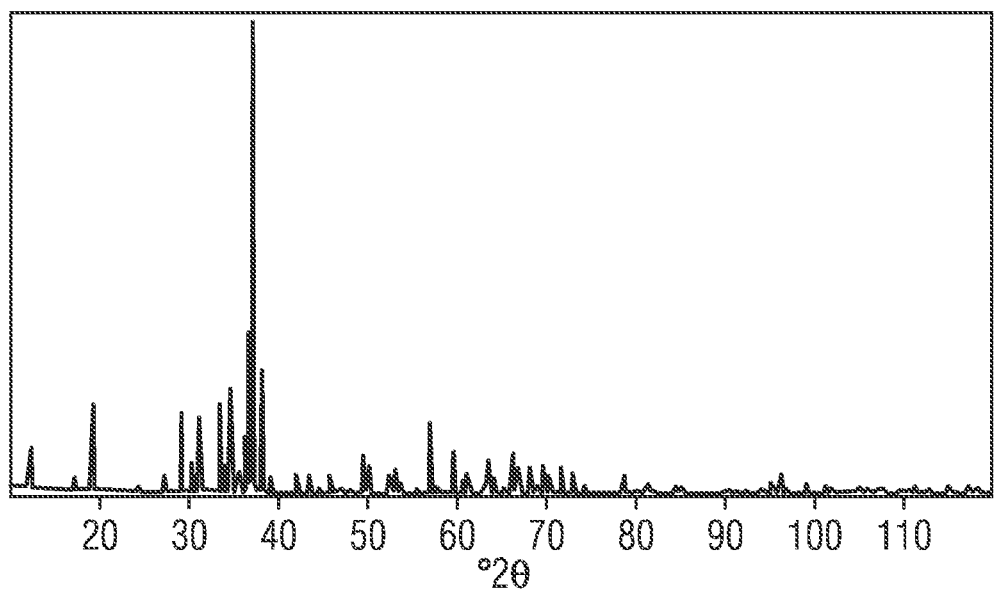
FIGS. 12A, 12B, 13A, 13B and 14 show an X-ray powder diffractogram using copper $K_{\alpha 1}$ radiation from an exemplary embodiment of a red-emitting phosphor.

FIG. 12A shows the X-ray powder diffractogram using copper $K_{\alpha 1}$ radiation of the fourth exemplary embodiment, which was synthesized as described in relation to FIG. 10. The diffraction angles are plotted on the x axis in ° 2θ values and the intensity is plotted on the y axis. The fourth exemplary embodiment also has two characteristic reflections in an angular range of 11.5-12.5° 2θ and in an angular range of 18.5-19.5° 2θ.

Figure 12B:
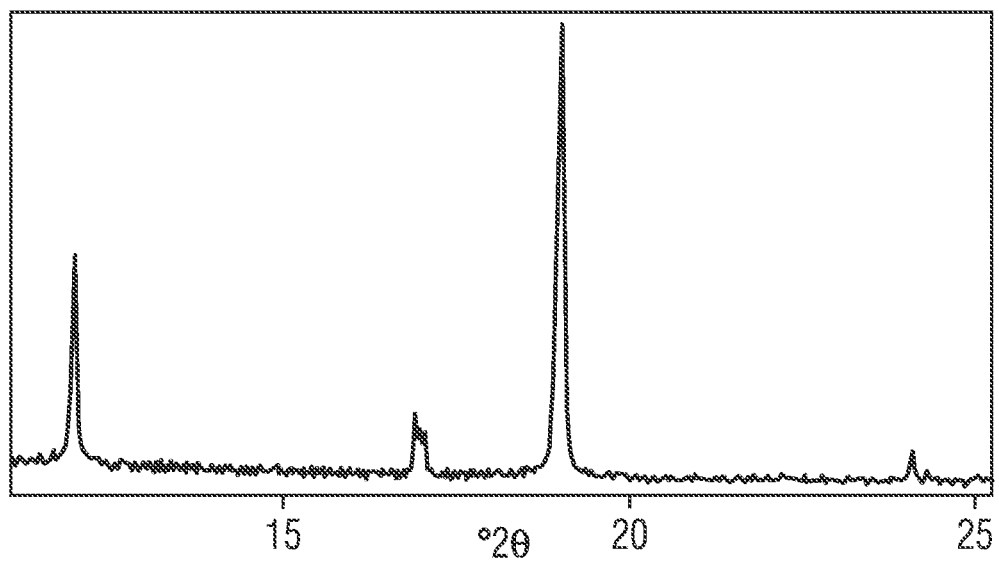

FIG. 12B shows a portion of the X-ray powder diffractogram from FIG. 12A. Here again, the two characteristic reflections in an angular range of 11.5-12.5° 2θ and in an angular range of 18.5-19.5° 2θ are clearly apparent.

Figure 13A:
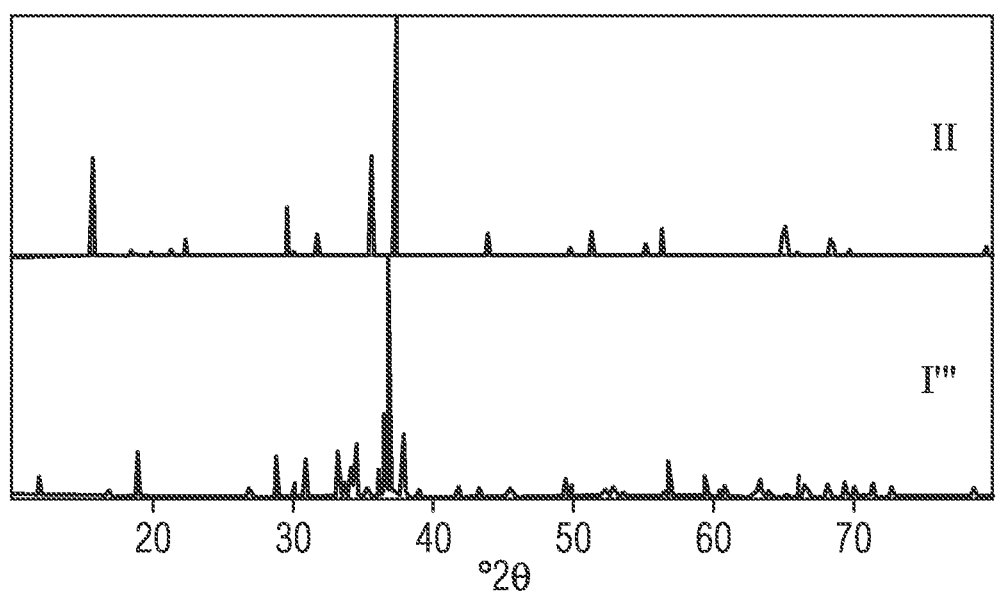

FIG. 13A shows two X-ray powder diffractograms using copper $K_{\alpha 1}$ radiation. The diffraction angles are plotted on the x axis in ° 2θ values and the intensity is plotted on the y axis. The X-ray powder diffractogram provided with reference sign I''' shows that of the fourth exemplary embodiment of the red-emitting phosphor according to the invention. The X-ray powder diffractogram provided with reference sign II shows that of a phosphor of formula $SrLiAl_3N_4:Eu^{2+}$. As in FIGS. 1 and 4 and 7, it is here also apparent that the known phosphor does not have the characteristic reflections of the phosphor according to the invention in an angular range of 11.5-12.5° 2θ and in the range 18.5-19.5° 2θ.

Figure 13B:
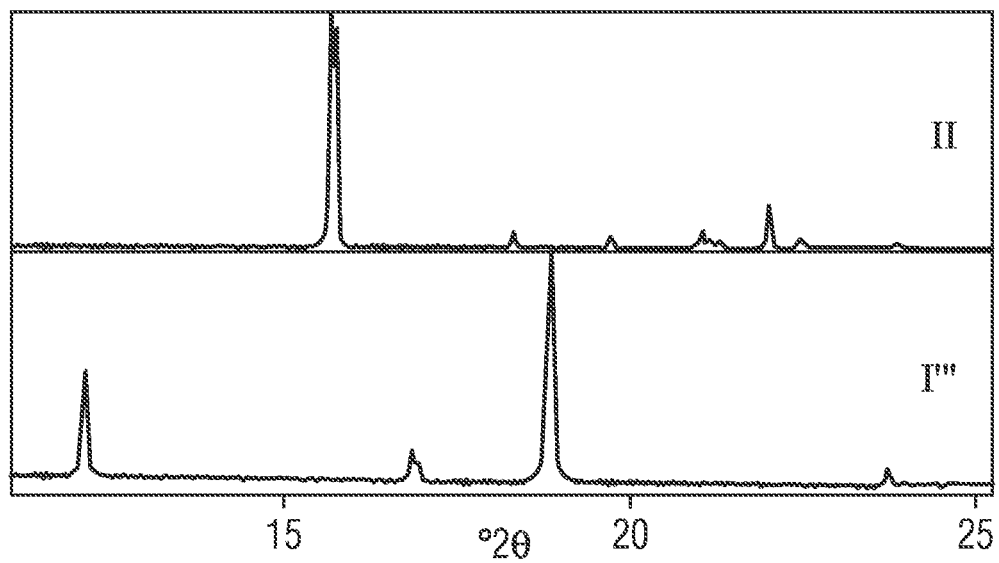

FIG. 13B shows a portion of the X-ray powder diffractogram of FIG. 13A.

Figure 14:
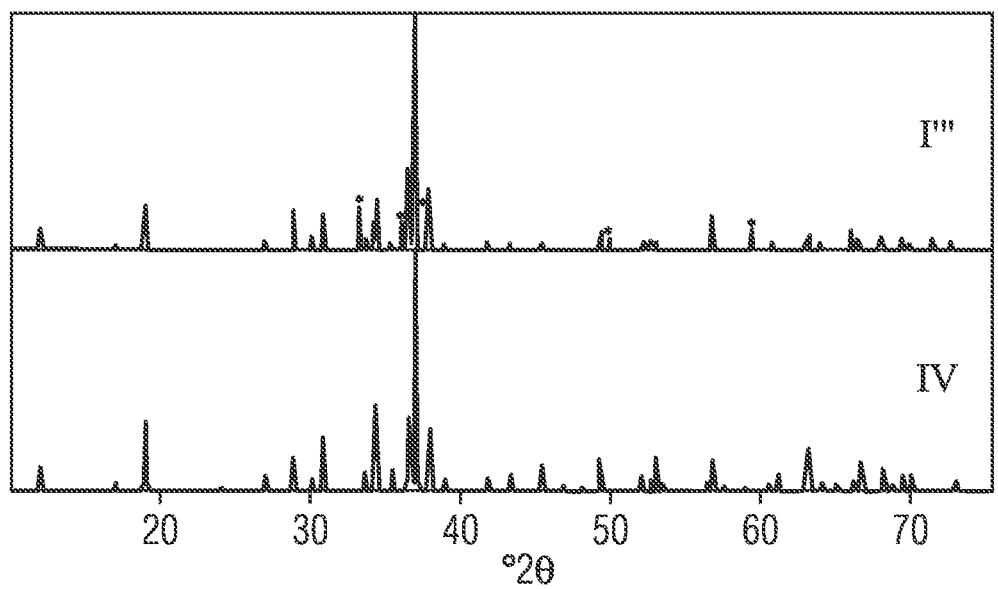

FIG. 14 shows two X-ray powder diffractograms using copper $K_{\alpha 1}$ radiation. The diffraction angles are plotted on the x axis in ° 2θ values and the intensity is plotted on the y axis. The X-ray powder diffractogram provided with reference sign I''' shows that the measured X-ray powder diffractogram of the fourth exemplary embodiment of the red-emitting phosphor according to the invention. The diffractogram provided with reference sign IV corresponds to the X-ray powder diffractogram calculated from single crystal data for the phosphor according to the invention of formula $Sr_{4-x}Eu_xLiAl_{11}N_{14}$. The reflections marked * should be assigned to a secondary phase of AlN. This may also result from the starting material or possibly also be attributable to partial decomposition of the phosphor. As is apparent, the match between the measured X-ray powder diffractogram with the reference sign I''' and the calculated diagram with the reference sign VI is very high.

Figure 15:
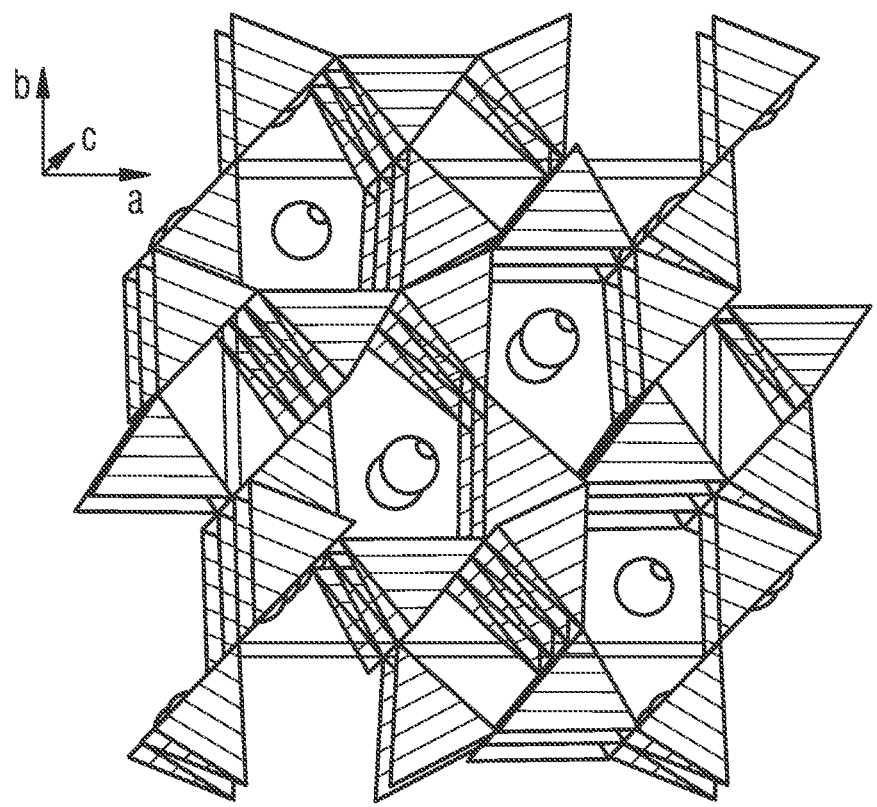
FIG. 15 shows a portion of the crystal structure of a red-emitting phosphor.

FIG. 15 shows the orthorhombic crystal structure of the phosphor $Sr_{4-x}Eu_xLiAl_{11}N_{14}$ in a schematic diagram. The phosphor crystallizes orthorhombically in the space group Pnnm. The structure of the phosphor was determined on the basis of single crystal diffraction data. The structure has corner-linked and edge-linked (Al,Li)N-tetrahedra. Sr atoms are arranged amongst the network of tetrahedra. Descriptions in other space groups are also possible. The phosphor according to the invention thus has the same atomic sequence as $K_2Zn_6O_7$.

FIG. 16A shows crystallographic data of $Sr_{4-x}Eu_xLiAl_{11}N_{14}$.

FIG. 16B shows atomic layers in the structure of $Sr_{4-x}Eu_xLiAl_{11}N_{14}$.

FIG. 16C shows anisotropic displacement parameters for $Sr_{4-x}Eu_xLiAl_{11}N_{14}$.

Figure 17:
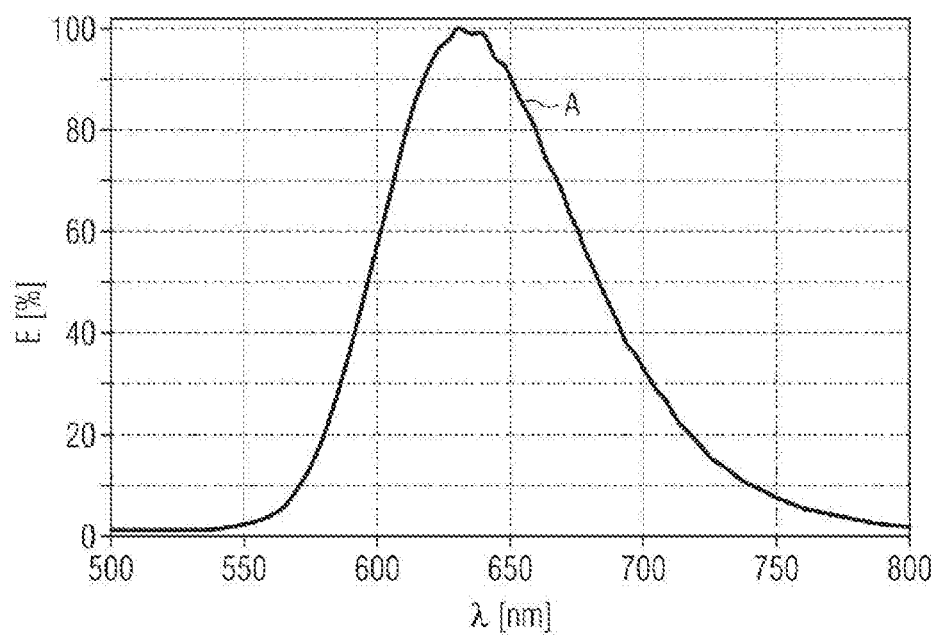
FIG. 17 shows the emission spectra from three substitution variants based on $Sr_4Eu_xLiAl_{11}N_{14}$.

FIG. 17 shows the emission spectra of three substitution variants of the phosphor $Sr_{4-x}Eu_xLiAl_{11}N_{14}$. Substitution variants should here be understood to mean that in these phosphors the elements Sr, Eu, Li, Al and/or N in the empirical formula $Sr_{4-x}Eu_xLiAl_{11}N_{14}$ are in part replaced by other elements. The wavelength in nanometers is plotted on the x axis and the emission intensity E in percent is plotted on the y axis. To measure the emission spectrum, the samples in the form of individual crystals were excited with blue light of a wavelength of 460 nm. By varying the composition, while preserving the half-value width, i.e., while preserving the atomic sequences, it is possible to achieve a significant shift in the emission bands towards shorter wavelengths, leading to a further increase in the overlap with the sensitivity of the eye and thus more efficient phosphors. The phosphor, which has the emission with reference sign A, shows in EDX measurements an Al:Si molar ratio of about 1:1 and has a peak wavelength of 636 nm and is thus markedly blueshifted compared with the unsubstituted phosphor $Sr_4LiAl_{11}N_{14}:Eu^{2+}$, which has a peak wavelength at 670 nm.

FIGS. 18A and 18B show tables with possible, electroneutral compounds, which may be achieved by substitution experiments, as with general empirical formula $(AX_aAY_bAZ_c)(BV_dBW_eBX_fBY_gBZ_h)(CX_nCY_j):E$. The substitutions shown are merely exemplary, other substitutions are likewise possible while preserving the crystal structure.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A phosphor comprising:
   an inorganic compound having one of the following empirical formulae:

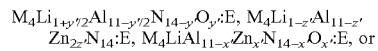

$M_4Li_{1+y''/2}Al_{11-y''/2}N_{14-y'}O_{y'}:E$, $M_4Li_{1-z'}Al_{11-z'}Zn_{2z'}N_{14}:E$, $M_4LiAl_{11-x}Zn_xN_{14-x}O_x:E$, or

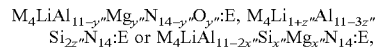

$M_4LiAl_{11-y''}Mg_{y''}N_{14-y'}O_{y''}:E$, $M_4Li_{1+z''}Al_{11-3z''}Si_{2z''}N_{14}:E$ or $M_4LiAl_{11-2x''}Si_{x''}Mg_{x''}N_{14}:E$, wherein M=Ca, Sr and/or Ba,
   wherein 0≤y'≤14, 0≤z'≤1, 0≤x'≤11, 0≤y''≤11, 0≤z''≤3 and 0≤x''≤5,
   wherein E is selected from the group consisting of Mn, Cr, Ni, Ce, Pr, Nd, Sm, Eu, Tb, Dy, Ho, Er, Yb, Tm, Li, Na, K, Rb, Cs and combinations thereof, and
   wherein the inorganic compound crystallizes in a crystal structure with the same atomic sequence as in $K_2Zn_6O_7$.

2. The phosphor according to claim 1, wherein M=Sr.

3. The phosphor according to claim 1, wherein the inorganic compound has one of the following empirical formulae:

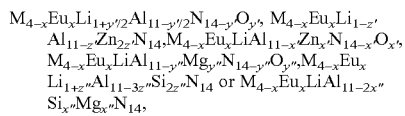, $M_{4-x}Eu_xLi_{1-z'}Al_{11-z'}Zn_{2z'}N_{14}, M_{4-x}Eu_xLiAl_{11-x}Zn_xN_{14-x}O_{x'}, M_{4-x}Eu_xLiAl_{11-y''}Mg_{y''}N_{14-y''}O_{y''}, M_{4-x}Eu_xLi_{1+z''}Al_{11-3z''}Si_{2z''}N_{14}$ or $M_{4-x}Eu_xLiAl_{11-2x''}Si_{x''}Mg_{x''}N_{14}$, wherein M=Ca, Sr and/or Ba, and
$0 \leq y' \leq 14$,
$0 \leq z' \leq 1$,
$0 \leq x' \leq 11$,
$0 \leq y'' \leq 11$,
$0 \leq z'' \leq 3$,
$0 \leq x'' \leq 5$ and
$0 < x \leq 2$.

4. The phosphor according to claim 1, wherein the inorganic compound has the following empirical formula:

wherein M=Ca, Sr and/or Ba, and $0 < x \leq 2$.

5. The phosphor according to claim 1, wherein the phosphor has an emission maximum in a range from 500 to 680 nm.

6. The phosphor according to claim 1, wherein the phosphor has a dominant wavelength of λ>500 nm.

7. A method for producing phosphor, wherein the phosphor comprises an inorganic compound, wherein the inorganic compound has one of the following empirical formulae:

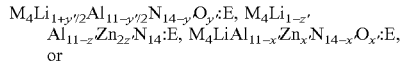

or

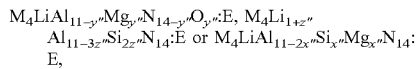

wherein $0 \leq y' \leq 14$, $0 \leq z' \leq 1$, $0 \leq x' \leq 11$, $0 \leq y'' \leq 11$, $0 \leq z'' \leq 3$ and $0 \leq x'' \leq 5$,
wherein M=Sr, and wherein E is selected from the group consisting of Mn, Cr, Ni, Ce, Pr, Nd, Sm, Eu, Tb, Dy, Ho, Er, Yb, Tm, Li, Na, K, Rb, Cs and combinations thereof, the method comprising:

mixing starting materials comprising $Li_3N$, $LiAlH_4$, $Sr_3N_2$, AlN and $EuF_3$ or $Li_3N$, $LiAlH_4$, $Sr_3N_2$, AlN, $SrH_2$ and $EuF_3$;

heating the mixture to a temperature of between 900 and 1400° C.;

annealing the mixture at a temperature of 900 to 1400° C. for five minutes to six hours; and cooling the mixture to room temperature.

8. The method according to claim 7, wherein method comprises performing the method between heating the mixture and cooling the mixture under a forming gas atmosphere.

9. A conversion element comprising the phosphor according to claim 1.

10. The conversion element according to claim 9, wherein the conversion element is a conversion element for an LED.

11. A method for using the phosphor according to claim 1, the method comprising:

converting incoming light, by the phosphor, into a longer-wave light.

12. A red-emitting phosphor according to claim 1, the red-emitting phosphor comprising:

an $Eu^{2+}$-doped nitridoaluminate phosphor, wherein, in a X-ray powder diffractogram using Cu—$K_{\alpha 1}$ radiation, the red-emitting phosphor has two characteristic reflections in an angular range of 11.5-12.5° 2θ and in an angular range of 18.5-19.5° 2θ.

13. The red-emitting phosphor according to claim 12, wherein a crystal structure of the $Eu^{2+}$-doped nitridoaluminate phosphor has the same atomic sequence as in $K_2Zn_6O_7$.

* * * * *